United States Patent
Hong et al.

(10) Patent No.: US 10,937,852 B2
(45) Date of Patent: Mar. 2, 2021

(54) ORGANIC LIGHT EMITTING DISPLAY APPARATUS

(71) Applicant: LG Display Co., Ltd., Seoul (KR)

(72) Inventors: Yewon Hong, Paju-si (KR); SungSoo Shin, Paju-si (KR); Hyelim Ji, Paju-si (KR); Sohee Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 78 days.

(21) Appl. No.: 16/163,779

(22) Filed: Oct. 18, 2018

(65) Prior Publication Data

US 2019/0131376 A1    May 2, 2019

(30) Foreign Application Priority Data

Oct. 31, 2017  (KR) .................... 10-2017-0143673

(51) Int. Cl.
| | |
|---|---|
| *H01L 27/32* | (2006.01) |
| *G09G 3/3275* | (2016.01) |
| *G09G 3/3266* | (2016.01) |
| *G09G 3/3233* | (2016.01) |
| *G09G 3/3291* | (2016.01) |

(52) U.S. Cl.
CPC ....... *H01L 27/3276* (2013.01); *G09G 3/3233* (2013.01); *G09G 3/3266* (2013.01); *G09G 3/3275* (2013.01); *G09G 3/3291* (2013.01); *G09G 2300/0819* (2013.01); *G09G 2300/0842* (2013.01); *G09G 2300/0861* (2013.01); *G09G 2310/0232* (2013.01); *G09G 2310/0251* (2013.01); *G09G 2310/0262* (2013.01)

(58) Field of Classification Search
None
See application file for complete search history.

(56) References Cited

U.S. PATENT DOCUMENTS

| | | | |
|---|---|---|---|
| 2015/0243220 A1 | 8/2015 | Kim et al. | |
| 2018/0006099 A1* | 1/2018 | Ka | H01L 27/3248 |
| 2019/0096330 A1* | 3/2019 | Kim | G09G 3/3233 |

FOREIGN PATENT DOCUMENTS

KR    2015-0100516 A    9/2015

* cited by examiner

*Primary Examiner* — Stephen T. Reed
(74) *Attorney, Agent, or Firm* — Fenwick & West LLP

(57) ABSTRACT

A display apparatus includes a plurality of pixels each including an organic light emitting device and a pixel driving circuit. The pixel driving circuit includes a driving transistor controlling a driving current flowing in the organic light emitting device and a first, second, third, fourth, and fifth switching transistor, the third switching transistor selectively connecting a second node which is a drain electrode of the driving transistor to a third node which is a gate electrode of the driving transistor. The third switching transistor differs from a type of each of the driving transistor and the first, second, fourth, and fifth switching transistors. Accordingly, even when the organic light emitting display apparatus is driven at a low frequency, a bezel area is reduced, and a high resolution of a display panel is realized.

19 Claims, 15 Drawing Sheets

REPLACEMENT SHEET
FIG. 5A
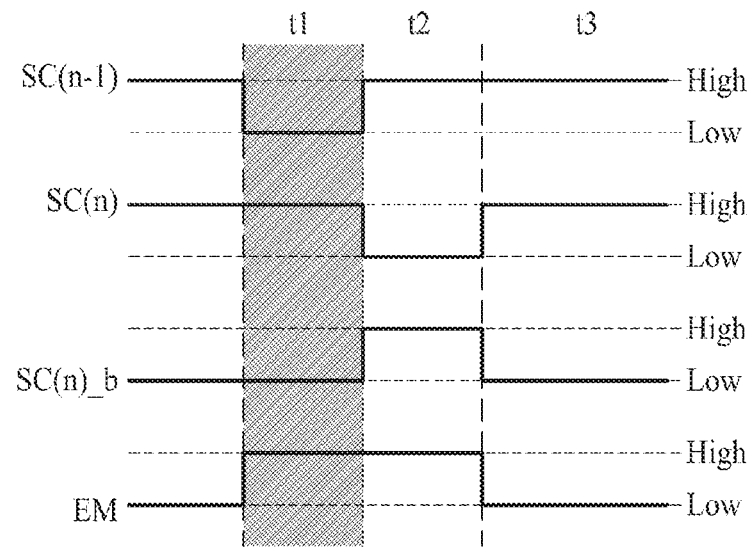
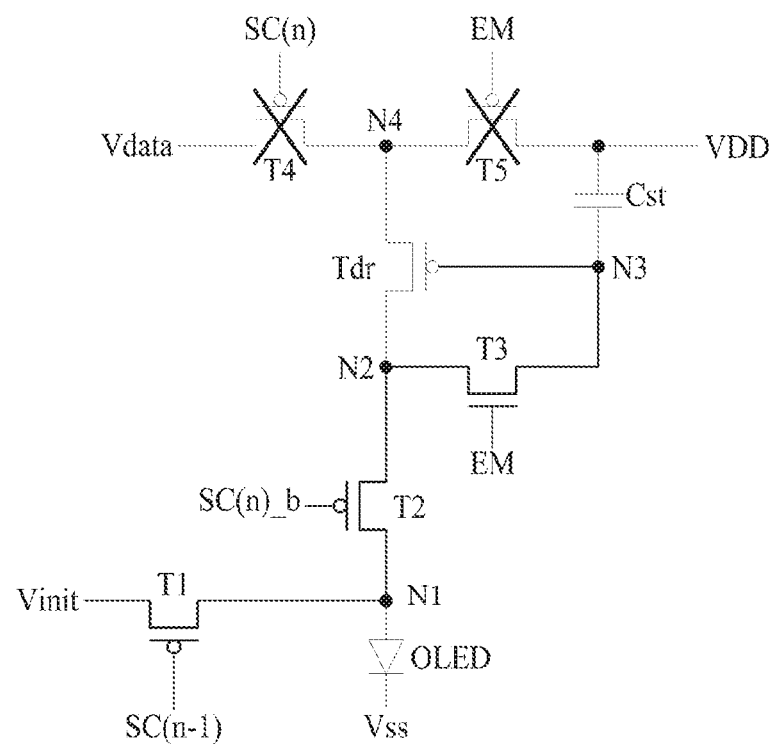

ORGANIC LIGHT EMITTING DISPLAY APPARATUS

CROSS-REFERENCE TO RELATED APPLICATION

This application claims the benefit of the Republic of Korea Patent Application No. 10-2017-0143673 filed on Oct. 31, 2017, which is hereby incorporated by reference as if fully set forth herein.

BACKGROUND

Field of the Disclosure

The present disclosure relates to an organic light emitting display apparatus.

Discussion of the Related Art

Recently, with the advancement of multimedia, the importance of display apparatuses is increasing. Therefore, flat panel display apparatuses such as liquid crystal display (LCD) apparatuses, organic light emitting display apparatuses, and light emitting diode display apparatuses are being used practically. The LCD apparatuses and the organic light emitting display apparatuses among the flat panel display apparatuses have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMPs), navigation devices, ultra-mobile personal computers (PCs), mobile phones, smartphones, smartwatches, tablet personal computers (PCs), watch phones, and mobile communication terminals.

LCD apparatuses and organic light emitting display apparatuses each include a display panel that includes a plurality of data lines, a plurality of scan lines, and a plurality of pixels connected to a corresponding data line and a corresponding scan line, a data driving circuit that supplies data signals to the data lines, and a scan driving circuit that supplies a scan signal (or a scan pulse) to the scan lines.

Each of the plurality of pixels is supplied with a data signal supplied through a corresponding data line from the data driving circuit in synchronization with the scan pulse through a corresponding scan line from the scan driving circuit, thereby displaying an image corresponding to the data signal.

A related art organic light emitting display apparatus is configured to reduce the bezel area and enhance a resolution by minimizing the number of scan lines and the number of transistors. Here, when the related art organic light emitting display apparatus is driven at a low frequency, a driving current supplied to an organic light emitting device is leaked, and due to this, the organic light emitting device is deteriorated and a luminance of a display panel is reduced. Also, if a metal oxide transistor for preventing the occurrence of a leakage current is used, scan lines and transistors are additionally needed, and due to this, there are limitations in minimizing the bezel area and enhancing a resolution. For this reason, it is not easy to drive the related art organic light emitting display apparatus at a low frequency, and it is difficult to minimize the bezel area and enhance a resolution.

SUMMARY

Accordingly, the present disclosure is directed to provide an organic light emitting display apparatus that substantially obviate one or more problems due to limitations and disadvantages of the related art.

An aspect of the present disclosure is directed to provide an organic light emitting display apparatus in which a metal oxide transistor is used, and thus, even when the organic light emitting display apparatus is driven at a low frequency, a bezel area is reduced and a high resolution of a display panel is realized.

Another aspect of the present disclosure is directed to provide an organic light emitting display apparatus in which, by using a metal oxide transistor, a leakage of a driving current is reduced, and the number of scan lines and the number of transistors are reduced.

Another aspect of the present disclosure is directed to provide an organic light emitting display apparatus in which, by using a metal oxide transistor, a pixel driving circuit has a high compensation rate for a driving current in all gray levels.

Another aspect of the embodiments of the present disclosure may be to provide a display apparatus comprising a plurality of pixels each including a light emitting device and a pixel driving circuit driving the light emitting device. The plurality of pixels are respectively provided in a plurality of pixel areas. The pixel driving circuit comprises a driving transistor controlling a driving current flowing in the light emitting device; a first switching transistor supplying an initialization voltage to a first node connected to the light emitting device; a second switching transistor selectively connecting the first node to a second node which is a drain electrode of the driving transistor; a third switching transistor selectively connecting the second node to a third node which is a gate electrode of the driving transistor; a fourth switching transistor supplying a data voltage to a fourth node which is a source electrode of the driving transistor; and a fifth switching transistor supplying a driving voltage to the fourth node, and the third switching transistor is a type which differs from a type of each of the driving transistor and the first, second, fourth, and fifth switching transistors.

Another aspect of the embodiments of the present disclosure may be to provide a display apparatus including a plurality of pixels, each of the pixels including a light emitting device and a pixel driving circuit driving the light emitting device. The pixel driving circuit includes: driving transistor connected to a node between the driving transistor and the light emitting device and controlling a driving current flowing in the light emitting device; a storage capacitor, one end of the storage capacitor connected to a gate electrode of the driving transistor; and a first transistor selectively connecting the node between the driving transistor and the light emitting device to the gate electrode of the driving transistor. The first transistor is different in type from the driving transistor. The first transistor may be a metal oxide transistor. The display apparatus may further include a second transistor configured to supply an initialization voltage to the node between the driving transistor and the light emitting device. The second transistor may be connected to the node between the driving transistor and the light emitting device. In one aspect, the second transistor is connected between the driving transistor and the light emitting device. In another aspect, the second transistor is connected between the driving transistor and an initialization voltage supply line configured to supply the initialization voltage the driving transistor.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display apparatus including a plurality of pixels each including an organic light emitting device and a pixel driving circuit driving the organic light emitting device, the plurality of pixels being respectively provided in a plurality of pixel areas, wherein the pixel driving circuit includes a driving transistor controlling a driving current flowing in the organic light emitting device, a first switching transistor supplying an initialization voltage to a first node connected to the organic light emitting device, a second switching transistor selectively connecting the first node to a second node which is a drain electrode of the driving transistor, a third switching transistor selectively connecting the second node to a third node which is a gate electrode of the driving transistor, a fourth switching transistor supplying a data voltage to a fourth node which is a source electrode of the driving transistor, and a fifth switching transistor supplying a driving voltage to the fourth node, and the third switching transistor is a type which differs from a type of each of the driving transistor and the first, second, fourth, and fifth switching transistors.

Details of other embodiments are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

FIGS. 5A to 5C are diagrams for describing a driving method of the pixel illustrated in FIG. 2.

DETAILED DESCRIPTION OF THE DISCLOSURE

Figure 1:
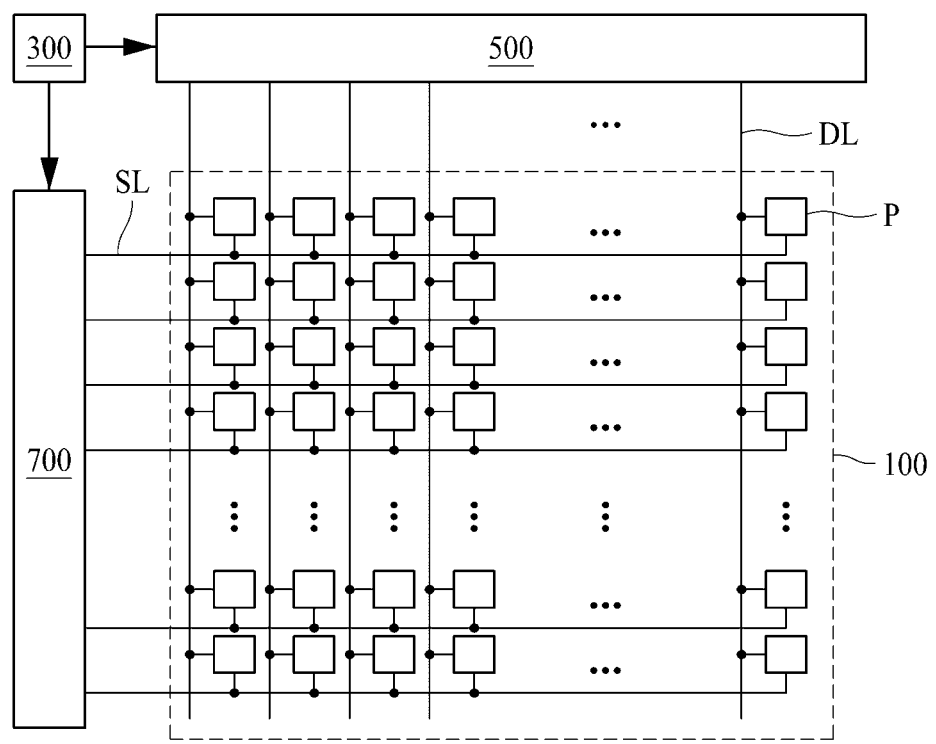
FIG. 1 is a diagram illustrating an organic light emitting display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Therefore, in the present disclosure, examples of the display apparatus may include a narrow-sense display apparatus itself, such as a liquid crystal module (LCM) or an organic light emitting display (OLED) module, and a set device which is a final consumer device or an application product including the LCM or the OLED module.

Moreover, if the display panel is the organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like).

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a diagram illustrating an organic light emitting display apparatus according to an embodiment of the present disclosure.

Referring to FIG. 1, the organic light emitting display apparatus may include a pixel array part 100, a control circuit 300, a data driving circuit 500, and a scan driving circuit 700.

The pixel array part 100 may include a plurality of scan lines SL and a plurality of data lines DL provided on a substrate and a plurality of pixels P respectively provided in a plurality of pixel areas defined by intersections of the plurality of scan lines SL and the plurality of data lines DL.

Each of the plurality of pixels P may include a pixel cell (not shown) which displays an image, based on a scan signal supplied through an adjacent scan line SL and a data signal supplied through an adjacent data line DL. In this case, the pixel cell may include at least one TFT and at least one capacitor and may be a liquid crystal cell which drives liquid crystal according to an electric field based on a data signal to display an image, or may be a self-emitting cell which self-emits light based on a data signal to display an image. Here, the self-emitting cell may include a plasma discharging element, a quantum dot light emitting element, an organic light emitting element, an inorganic light emitting element, or a micro light emitting diode.

The control circuit 300 may generate pixel data corresponding to each of the plurality of pixels P, based on an image signal. The control circuit 300 may generate a data control signal, based on a timing synchronization signal and may supply the data control signal to the data driving circuit 500. According to an embodiment, the control circuit 300 may generate a scan control signal including a plurality of scan clock signals and a start signal, based on the timing synchronization signal and may supply the scan control signal to the scan driving circuit 700. The control circuit 300 may additionally generate a plurality of carry clock signals to supply the plurality of carry clock signals to the scan driving circuit 700, based on a driving manner of the scan driving circuit 700.

The data driving circuit 500 may be connected to the plurality of data lines DL provided in the pixel array part 100. The data driving circuit 500 may receive pixel data and the data control signal supplied from the control circuit 300 and may receive a plurality of reference gamma voltages supplied from a power source circuit. The data driving circuit 500 may convert the pixel data into a pixel-based analog data signal by using the data control signal and the plurality of reference gamma voltages and may supply the pixel-based data signal to a corresponding data line DL.

The scan driving circuit 700 may be connected to the plurality of scan lines provided in the pixel array part 100. The scan driving circuit 700 may generate a scan signal and may supply the scan signal to a corresponding scan line SL in a predetermined order, based on the scan control signal supplied from the control circuit 300.

The scan driving circuit 700 according to an embodiment may be integrated in one edge or both edges of the substrate and may be connected to the plurality of scan lines SL in a one-to-one relationship through a process of manufacturing a TFT. The scan driving circuit 700 according to an embodiment may be provided in an IC, mounted on or the substrate or a flexible circuit film, and connected to the plurality of scan lines SL in a one-to-one relationship.

Figure 2:
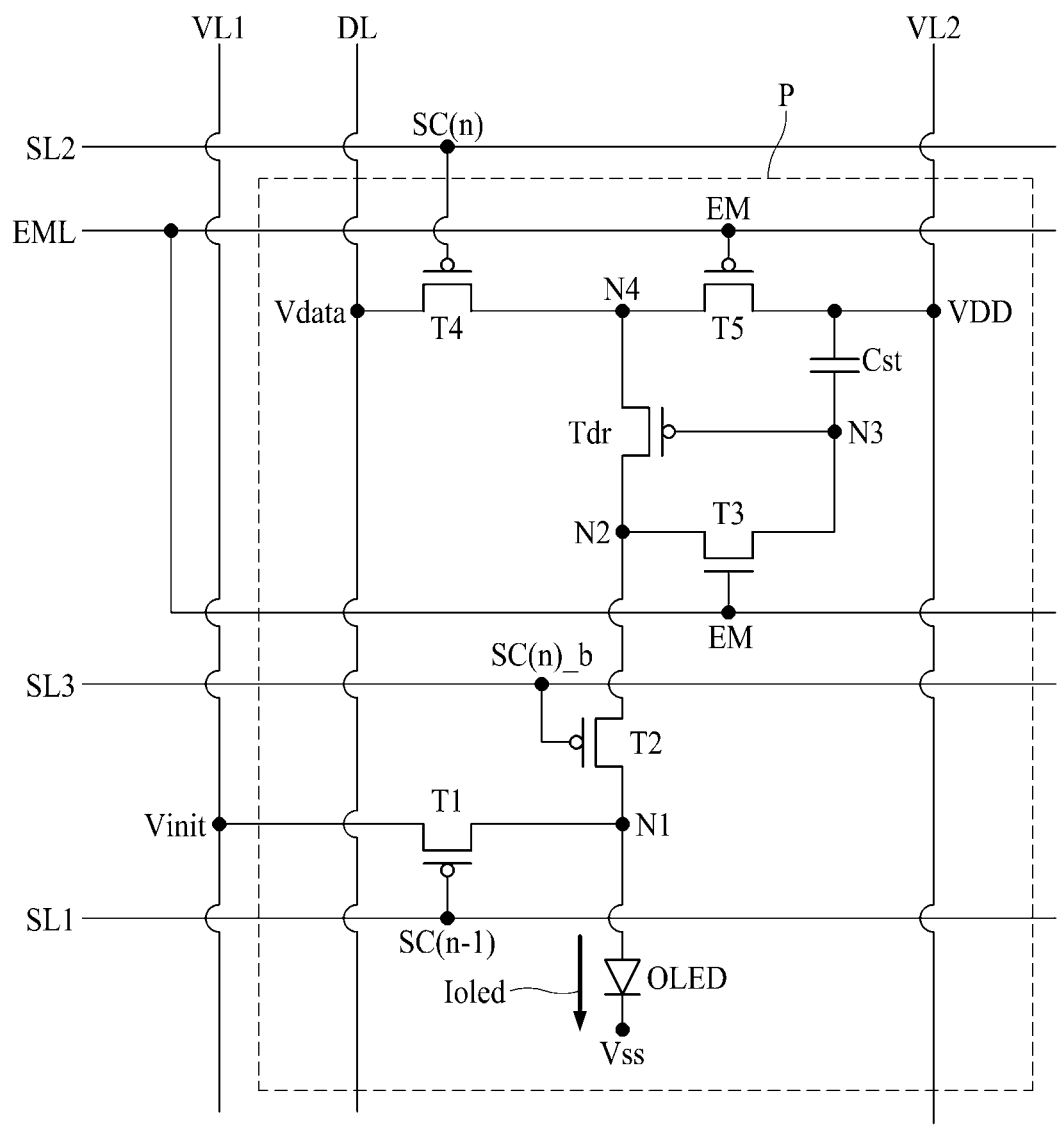
FIG. 2 is a diagram illustrating a structure of a pixel according to a first embodiment of the present disclosure, in an organic light emitting display apparatus according to an embodiment of the present disclosure.
Figure 3:
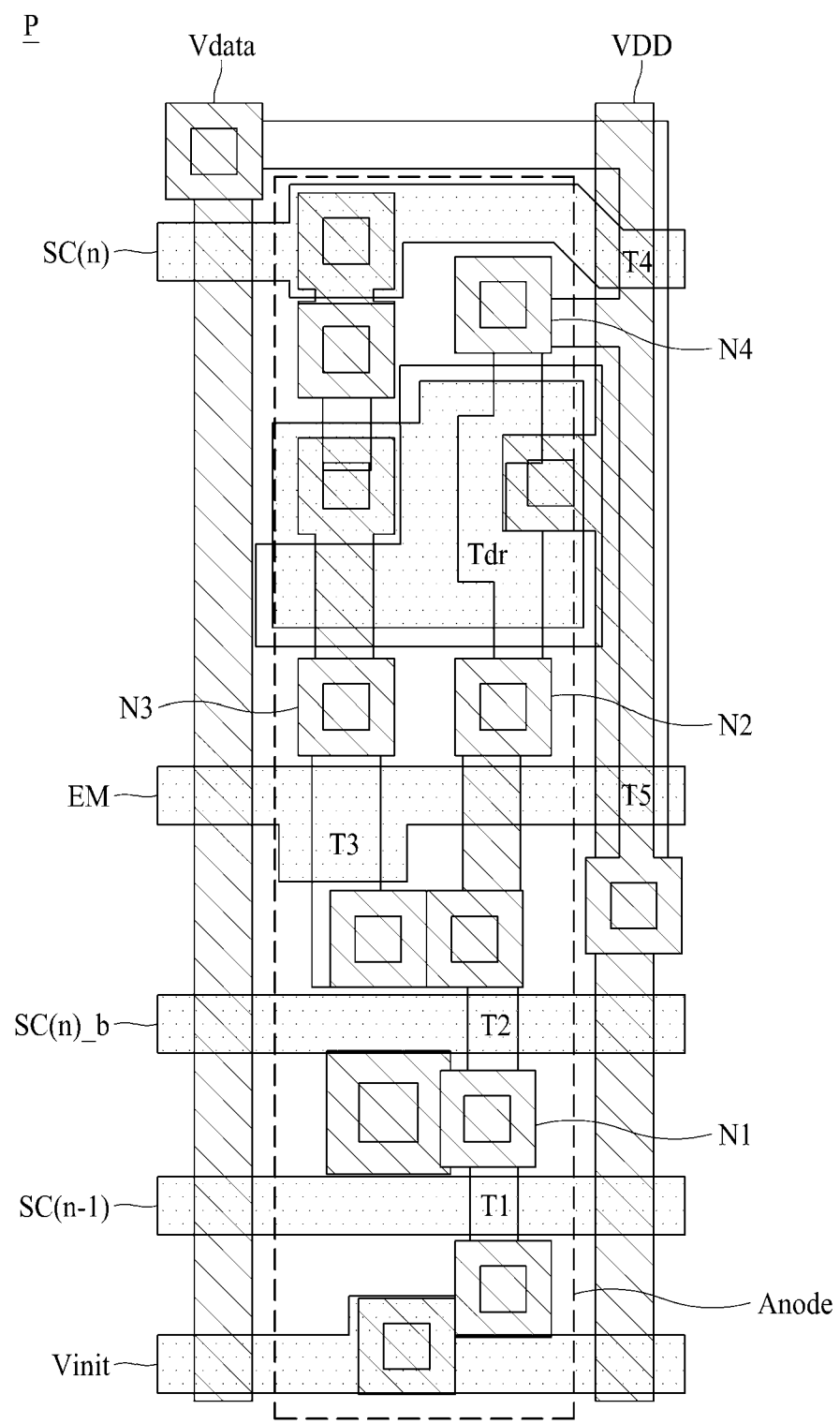
FIG. 3 is a layout diagram of the pixel illustrated in FIG. 2.

FIG. 2 is a diagram illustrating a structure of a pixel according to a first embodiment of the present disclosure, in an organic light emitting display apparatus according to an embodiment of the present disclosure, and FIG. 3 is a layout diagram of the pixel illustrated in FIG. 2.

Referring to FIGS. 2 and 3, a plurality of pixels P may each include an organic light emitting device OLED and a pixel driving circuit for driving the organic light emitting device OLED.

The organic light emitting device OLED may is supplied with a driving current from the pixel driving circuit to emit light. The organic light emitting device OLED may be connected to a first node N1 which is a second electrode of a second switching transistor T2 serially connected to a driving transistor Tdr. Here, the organic light emitting device OLED may include an anode electrode connected to the first node N1, an organic layer (not shown) provided on the anode electrode, and a cathode electrode connected to the organic layer. For example, the organic layer may have a structure of a hole transport layer/organic light emitting layer/electron transport layer or a structure of a hole injection layer/hole transport layer/organic light emitting layer/electron transport layer/electron injection layer. Furthermore, the organic layer may further include a function layer for enhancing the emission efficiency and lifetime of the organic light emitting layer. Also, the cathode electrode may be provided in a lengthwise direction of a scan line SL or a data line DL, or may be connected to all of the pixels P in common. The organic light emitting device OLED may emit light with a driving current Ioled which flows according to driving of the driving transistor Tdr.

The pixel driving circuit may control the driving current Ioled flowing in the organic light emitting device OLED to drive the organic light emitting device OLED. The pixel driving circuit may include the driving transistor Tdr and first to fifth switching transistors T1 to T5.

The driving transistor Tdr may control the driving current Ioled flowing in the organic light emitting device OLED. In detail, the driving transistor Tdr may be connected between a fourth node N4 and a second node N2 and may supply the driving current Ioled to the second switching transistor T2. For example, the source electrode of the driving transistor Tdr may be connected to the fourth node N4, a drain electrode of the driving transistor Tdr may be connected to the second node N2, and a gate electrode of the driving transistor Tdr may be connected to a third node N3. Also, the source electrode of the driving transistor Tdr may be connected to a drain electrode of the fourth switching transistor T4 and a drain electrode of the fifth switching transistor T5 through the fourth node N4. Also, the drain electrode of the driving transistor Tdr may be connected to a drain electrode of the third switching transistor T3 and a first electrode of the second switching transistor T2 through the second node N2. Also, a gate electrode of the driving transistor Tdr may be connected to one end of a storage capacitor Cst and a source electrode of the third switching transistor T3 through the third node N3. Therefore, the driving transistor Tdr may be turned on based on a voltage of the third node N3 and may supply the driving current Ioled, supplied from the fourth node N4, to the second node N2.

According to an embodiment, the driving transistor Tdr may correspond to a p-type transistor and may output, through the drain electrode, a current flowing to the source electrode, based on a voltage applied to the gate electrode. Here, the source electrode and the drain electrode of the driving transistor Tdr may switch therebetween, based on a direction of the current. Hereinafter, however, the source electrode and the drain electrode of the driving transistor Tdr may be determined with respect to a direction in which the driving current Ioled flows, based on a driving method of each of the pixels P.

The first switching transistor T1 may supply an initialization voltage Vinit to the first node N1 connected to the organic light emitting device OLED. In detail, the first switching transistor T1 may be connected between an initialization voltage supply line VL1 and the first node N1 and may supply the initialization voltage Vinit to the first node N1. For example, a source electrode of the first switching transistor T1 may be connected to the initialization voltage supply line VL1, a drain electrode of the first switching transistor T1 may be connected to the first node N1, and a gate electrode of the first switching transistor T1 may be connected to a first scan line SL1. Also, the source electrode of the first switching transistor T1 may be supplied with the initialization voltage Vinit1 through the initialization voltage supply line VL1, and the gate electrode of the first switching transistor T1 may be supplied with a first scan signal SC(n−1) through a first scan line SL1. Also, the drain electrode of the first switching transistor T1 may be connected to the anode electrode of the organic light emitting device OLED and a second electrode of the second switching transistor T2 through the first node N1. Therefore, the first switching transistor T1 may be turned on based on the first scan signal SC(n−1) and may supply the initialization voltage Vinit, supplied through the initialization voltage supply line VL1, to the first node N1.

According to an embodiment, the first switching transistor T1 may correspond to a p-type transistor and may output, through the drain electrode, a current flowing to the source electrode, based on a voltage applied to the gate electrode. Here, the source electrode and the drain electrode of the first switching transistor T1 may switch therebetween, based on a direction of the current. Hereinafter, however, the source electrode and the drain electrode of the first switching transistor T1 may be determined with respect to a direction in which the initialization voltage Vinit is output to the first node N1, based on a driving method of each pixel P.

The second switching transistor T2 may selectively connect the first node N1 to the second node N2 which is the drain electrode of the driving transistor Tdr. In detail, the second switching transistor T2 may be connected between the first node N1 and the second node N2 and may supply the initialization voltage Vinit, supplied through the first switching transistor T1, to the third switching transistor T3 or may supply the driving current Ioled, supplied through the driving transistor Tdr, to the organic light emitting device OLED. For example, a first electrode of the second switching transistor T2 may be connected to the second node N2, a second electrode of the second switching transistor T2 may be connected to the first node N1, and a gate electrode of the second switching transistor T2 may be connected to a third scan line SL3. Also, the first electrode of the second switching transistor T2 may be connected to the drain electrode of the driving transistor Tdr and the drain electrode of the third switching transistor T3 through the second node N2. Also, the second electrode of the second switching transistor T2 may be connected to the drain electrode of the first switching transistor T1 and the anode electrode of the organic light emitting device OLED through the first node N1. Also, the gate electrode of the second switching transistor T2 may be supplied with a third scan signal SC(n)_b through a third scan line SL3. Here, the third scan signal SC(n)_b may correspond to a signal opposite to the second scan signal SC(n). For example, when the third scan signal SC(n)_b has a high level, the second scan signal SC(n) may have a low level, and when the third scan signal SC(n)_b has a low level, the second scan signal SC(n) may have a high level. Therefore, the second switching transistor T2 may be turned on based on the third scan signal SC(n)_b and may supply the initialization voltage Vinit, supplied through the first switching transistor T1, to the third switching transistor T3 or may supply the driving current Ioled, supplied through the driving transistor Tdr, to the organic light emitting device OLED.

According to an embodiment, the second switching transistor T2 may correspond to a p-type transistor and may output, through the drain electrode, a current flowing to the source electrode, based on a voltage applied to the gate electrode. Here, each of the first electrode and the second electrode of the second switching transistor T2 may correspond to a source electrode or a drain electrode, based on a direction of the current. For example, in a case where the first electrode of the second switching transistor T2 supplies the initialization voltage Vinit to the third switching transistor T3, the first electrode of the second switching transistor T2 may correspond to a drain electrode, and in a case where the first electrode of the second switching transistor T2 is supplied with the driving current Ioled from the driving transistor Tdr, the first electrode of the second switching transistor T2 may correspond to a source electrode. Also, in a case where the second electrode of the second switching transistor T2 is supplied with the initialization voltage Vinit from the first switching transistor T1, the second electrode of the second switching transistor T2 may correspond to a source electrode, and in a case where the second electrode of the second switching transistor T2 supplies the driving current Ioled to the organic light emitting device OLED, the second electrode of the second switching transistor T2 may correspond to a drain electrode.

The third switching transistor T3 may selectively connect the second node N2 to the third node N3 which is the gate electrode of the driving transistor Tdr. In detail, the third switching transistor T3 may be connected between the second node N2 and the third node N3 and may supply the initialization voltage Vinit to the gate electrode of the driving transistor Tdr or may supply a voltage of the second node N2 to the third node N3. For example, a drain electrode of the third switching transistor T3 may be connected to the second node N2, a source electrode of the third switching transistor T3 may be connected to the third node N3, and a gate electrode of the third switching transistor T3 may be connected to an emission control line EML. Also, the drain electrode of the third switching transistor T3 may be connected to the drain electrode of the driving transistor Tdr and the first electrode of the second switching transistor T2 through the second node N2. Also, the source electrode of the third switching transistor T3 may be connected to the gate electrode of the driving transistor Tdr and the one end of the storage capacitor Cst through the third node N3. Also, the gate electrode of the third switching transistor T3 may be supplied with an emission signal EM through the emission control line EML. Therefore, the third switching transistor T3 may be turned on based on the emission signal EM and may supply the initialization voltage Vinit, supplied from the second node N2, to the third node N3 or may supply the voltage of the second node N2 to the third node N3.

According to an embodiment, the third switching transistor T3 may correspond to a transistor having a type which differs from that of each of the driving transistor Tdr and the first, second, fourth, and fifth switching transistors T1, T2, T4, and T5. For example, the third switching transistor T3 may correspond to an n-type transistor, and each of the driving transistor Tdr and the first, second, fourth, and fifth switching transistors T1, T2, T4, and T5 may correspond to a p-type transistor. The third switching transistor T3 may output, through the source electrode, a current flowing to the drain electrode, based on a voltage applied to the gate electrode. Here, the source electrode and the drain electrode of the third switching transistor T3 may switch therebetween, based on a direction of the current. Hereinafter, however, the source electrode and the drain electrode of the third switching transistor T3 may be determined with respect to a direction in which the voltage of the second node N2 is supplied to the third node N3, based on a driving method of each pixel P.

The fourth switching transistor T4 may supply a data voltage Vdata to the fourth node N4 which is the source electrode of the driving transistor Tdr. In detail, the fourth switching transistor T4 may be connected between the data line DL and the fourth node N4 and may supply the data voltage Vdata to the fourth node N4. For example, a source electrode of the fourth switching transistor T4 may be connected to the data line DL, a drain electrode of the fourth switching transistor T4 may be connected to the fourth node N4, and a gate electrode of the fourth switching transistor T4 may be connected to a second scan line SL2. Also, the source electrode of the fourth switching transistor T4 may be supplied with the data voltage Vdata through the data line DL, and the gate electrode of the fourth switching transistor T4 may be supplied with the second scan signal SC(n) through the second scan line SL2. Also, the drain electrode of the fourth switching transistor T4 may be connected to the source electrode of the driving transistor Tdr and a drain electrode of the fifth switching transistor T5 through the fourth node N4. Therefore, the fourth switching transistor T4 may be turned on based on the second scan signal SC(n) and may supply the data voltage Vdata, supplied through the data line DL, to the fourth node N4.

According to an embodiment, the fourth switching transistor T4 may correspond to a p-type transistor and may output, through the drain electrode, a current flowing to the source electrode, based on a voltage applied to the gate electrode. Here, the source electrode and the drain electrode of the fourth switching transistor T4 may switch therebetween, based on a direction of the current. Hereinafter, however, the source electrode and the drain electrode of the fourth switching transistor T4 may be determined with respect to a direction in which the data voltage Vdata is output to the fourth node N4, based on a driving method of each pixel P.

The fifth switching transistor T5 may supply a driving voltage VDD to the fourth node N4 which is the source electrode of the driving transistor Tdr. In detail, the fifth switching transistor T5 may be connected between the driving voltage supply line VL2 and the fourth node N4 and may supply the driving voltage VDD to the fourth node N4. For example, a source electrode of the fifth switching transistor T5 may be connected to the driving voltage supply line VL2, a drain electrode of the fifth switching transistor T5 may be connected to the fourth node N4, and a gate electrode of the fifth switching transistor T5 may be connected to the emission control line EML. Also, the source electrode of the fifth switching transistor T5 may be supplied with the driving voltage VDD through the driving voltage supply line VL2, and the gate electrode of the fifth switching transistor T5 may be supplied with the emission signal EM through the emission control line EML. Also, the drain electrode of the fifth switching transistor T5 may be connected to the source electrode of the driving transistor Tdr and the drain electrode of the fourth switching transistor T4 through the fourth node N4. Therefore, the fifth switching transistor T5 may be turned on based on the emission signal EM and may supply the driving voltage VDD, supplied through the driving voltage supply line VL2, to the fourth node N4.

According to an embodiment, the fifth switching transistor T5 may correspond to a p-type transistor and may output, through the drain electrode, a current flowing to the source electrode, based on a voltage applied to the gate electrode. Here, the source electrode and the drain electrode of the fifth switching transistor T5 may switch therebetween, based on a direction of the current. Hereinafter, however, the source electrode and the drain electrode of the fifth switching transistor T5 may be determined with respect to a direction in which the driving voltage VDD is output to the fourth node N4, based on a driving method of each pixel P.

According to an embodiment, the third switching transistor T3 may be implemented with a metal oxide transistor. In the organic light emitting display apparatus according to an embodiment of the present disclosure, the third switching transistor T3 may be implemented with the metal oxide transistor which differs from the driving transistor Tdr and the first, second, fourth, and fifth switching transistors T1, T2, T4, and T5, and thus, even when the organic light emitting display apparatus is driven at a low frequency, a bezel area is reduced and a high resolution of a display panel is realized. Also, in the organic light emitting display apparatus according to an embodiment of the present disclosure, since the third switching transistor T3 is implemented with the metal oxide transistor, a leakage of the driving current Ioled is reduced, the number of scan lines SL and the number of transistors are reduced, and the pixel driving circuit has a high compensation rate for the driving current Ioled in all gray levels.

Figure 4:
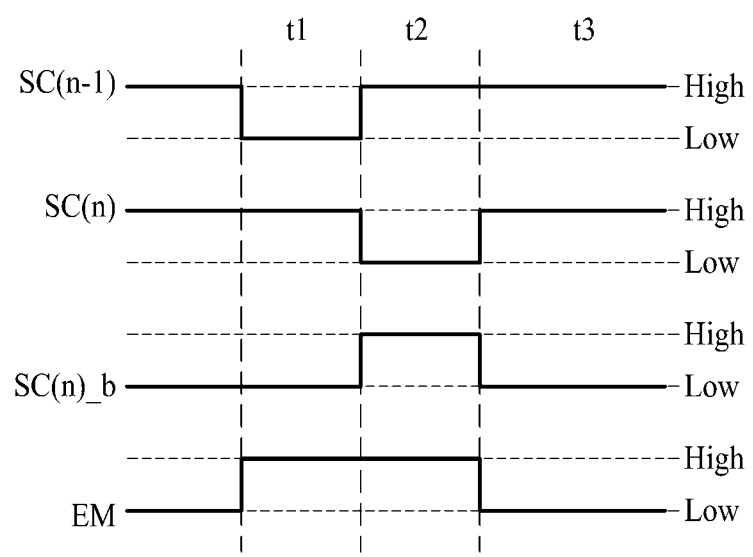
FIG. 4 is a waveform diagram of signals supplied to the pixel illustrated in FIG. 2.

FIG. 4 is a waveform diagram of signals supplied to the pixel illustrated in FIG. 2.

Referring to FIG. 4, each of the plurality of pixels P may be divisionally driven in an initialization period t1, a sampling period t2, and an emission period t3. Here, the initialization period t1 and the sampling period t2 may correspond to the same period, and the emission period t3 may correspond to a period other than the initialization period t1 and the sampling period t2 in one frame.

The first scan line SL1 may be connected to the gate electrode of the first switching transistor T1. In detail, the first scan line SL1 may supply the first scan signal SC(n−1) to the gate electrode of the first switching transistor T1 to turn on/off the first switching transistor T1. Here, the first scan signal SC(n−1) may have a low level Low in only the initialization period t1 and may have a high level High in the sampling period t2 and the emission period t3. Therefore, in only the initialization period t1, the first switching transistor T1 may receive the first scan signal SC(n−1) having the low level Low, and thus, may be turned on to supply the initialization voltage Vinit to the first node N1.

Here, since the low level Low of the first scan signal SC(n−1) is supplied to the gate electrode of the first switching transistor T1 during the initialization period t1, the low level Low of the first scan signal SC(n−1) may be set so that a source-gate voltage Vsg of the first switching transistor T1 is higher than a threshold voltage Vth of the first switching transistor T1. Therefore, during the initialization period t1, the source-gate voltage Vsg of the first switching transistor T1 may correspond to a difference voltage "Vinit−SC(n−1)" between the initialization voltage Vinit and the first scan signal SC(n−1), and the low level Low of the first scan signal SC(n−1) may be determined so that the difference voltage "Vinit−SC(n−1)" is higher than the threshold voltage Vth of the first switching transistor T1 (Vinit−SC(n−1)>Vth). Hereinafter, a low level Low of each of the second scan signal SC(n), the third scan signal SC(n)_b, and the emission signal EM may be determined based on the same principle.

The second scan line SL2 may be connected to the gate electrode of the fourth switching transistor T4. In detail, the second scan line SL2 may supply the second scan signal SC(n) to the gate electrode of the fourth switching transistor T4 to turn on/off the fourth switching transistor T4. Here, the second scan signal SC(n) may be generated by time-shifting the first scan signal SC(n−1). Also, the second scan signal SC(n) may have a low level Low in only the sampling period t2 and may have a high level High in the initialization period t1 and the emission period t3. Therefore, in only the sampling period t2, the fourth switching transistor T4 may receive the second scan signal SC(n) having the low level Low, and thus, may be turned on to supply the data voltage Vdata to the fourth node N4.

The third scan line SL3 may be connected to the gate electrode of the second switching transistor T2. In detail, the third scan line SL3 may supply the third scan signal SC(n)_b to the gate electrode of the second switching transistor T2 to turn on/off the second switching transistor T2. Here, the third scan signal SC(n)_b may be a signal opposite to the second scan signal SC(n). For example, when the third scan signal SC(n)_b has the high level High, the second scan signal SC(n) may have the low level Low, and when the third scan signal SC(n)_b has the low level Low, the second scan signal SC(n) may have the high level High. Also, the third scan signal SC(n)_b may have the high level High in only the sampling period t2 and may have the low level Low in the initialization period t1 and the emission period t3. Therefore, in the initialization period t1, the fourth switching transistor T4 may receive the third scan signal SC(n)_b having the low level Low, and thus, may be turned on to supply the initialization voltage Vinit to the second node N2. Also, in the emission period t3, the fourth switching transistor T4 may receive the third scan signal SC(n)_b having the low level Low, and thus, may be turned on to supply the driving current Ioled to the anode electrode of the organic light emitting device OLED.

The emission control line EML may be connected to the gate electrode of each of the third and fifth switching transistors T3 and T5. In detail, the emission control line EML may supply the emission signal EM to the gate electrode of each of the third and fifth switching transistors T3 and T5 to turn on/off the third and fifth switching transistors T3 and T5. Here, the emission signal EM may have a high level High in the initialization period t1 and the sampling period t2 and may have the low level Low in the emission period t3. Therefore, in the initialization period t1, the third switching transistor T3 may receive the emission signal EM having the high level High, and thus, may be turned on to supply the initialization voltage Vinit to the third node N3. Also, in the sampling period t2, the third switching transistor T3 may receive the emission signal EM having the high level High, and thus, may be turned on to supply the voltage of the second node N2 to the third node N3. In this case, during the sampling period t2, a voltage applied to the gate electrode and the drain electrode of the driving transistor Tdr may correspond to a difference voltage "Vdata−|Vth|" between the data voltage Vdata and the threshold voltage Vth of the driving transistor Tdr. Also, in the emission period t3, the fifth switching transistor T5 may receive the emission signal EM having the low level Low, and thus, may be turned on to supply the driving voltage VDD to the fourth node N4.

Figure 5B:
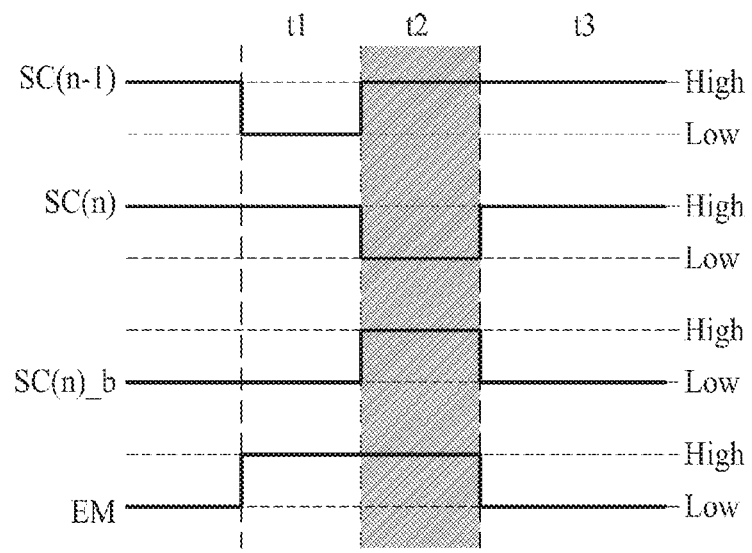
Figure 5B:
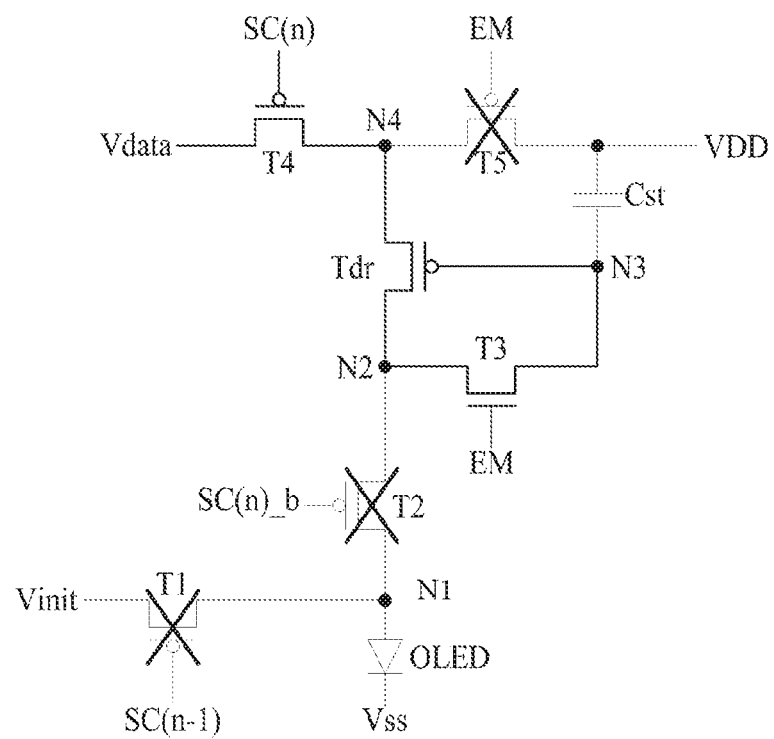
Figure 5C:
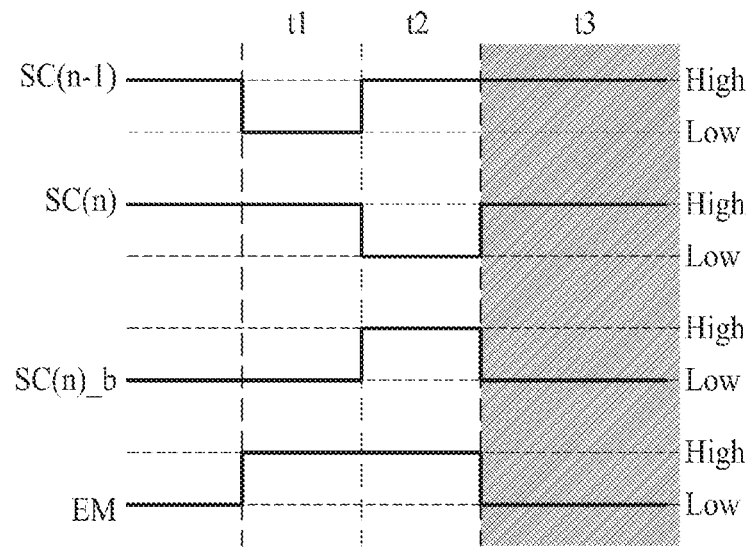
Figure 5C:
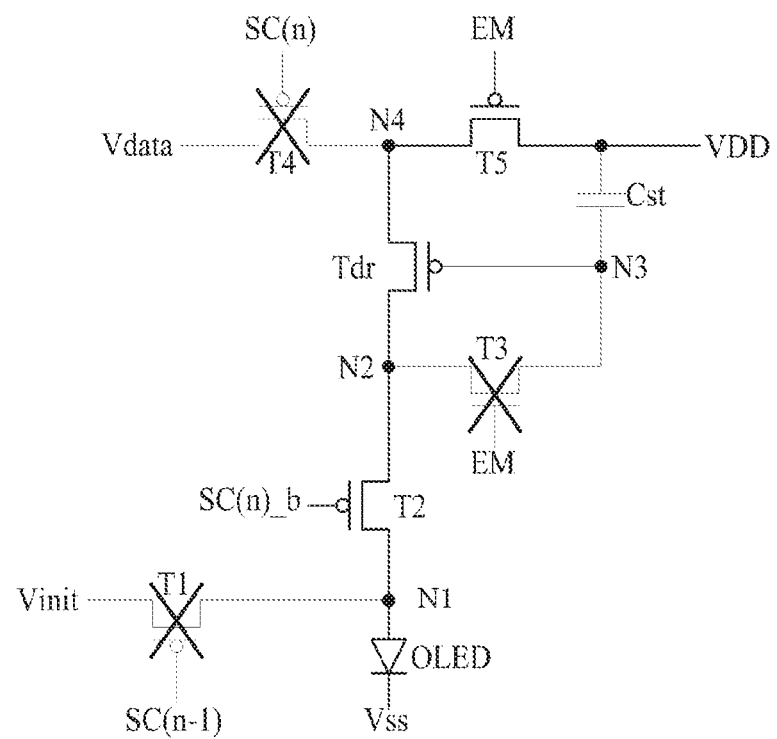

FIGS. 5A to 5C are diagrams for describing a driving method of the pixel illustrated in FIG. 2. In detail, FIG. 5A illustrates a driving method of a pixel P during an initialization period t1, FIG. 5B illustrates a driving method of the pixel P during a sampling period t2, and FIG. 5C illustrates a driving method of the pixel P during an emission period t3.

Referring to FIG. 5A, each of the plurality of pixels P may be divisionally driven in the initialization period t1, the sampling period t2, and the emission period t3.

In the initialization period t1, the first switching transistor T1 may be turned on based on the first scan signal SC(n−1) and may supply the initialization voltage Vinit to the first node N1. In detail, the first switching transistor T1 may be connected between the initialization voltage supply line VL1 and the first node N1. The source electrode of the first switching transistor T1 may be supplied with the initialization voltage Vinit through the initialization voltage supply line VL1, and the drain electrode of the first switching transistor T1 may be connected to the anode electrode of the organic light emitting device OLED and the second electrode of the second switching transistor T2 through the first node N1. Also, during the initialization period t1, the gate electrode of the first switching transistor T1 may be supplied with the first scan signal SC(n−1) having a low level Low through the first scan line SL1. Therefore, in the initialization period t1, the first switching transistor T1 may be turned on and may supply the initialization voltage Vinit to the first node N1.

In the initialization period t1, the second switching transistor T2 may be turned on based on the third scan signal SC(n)_b and may supply the initialization voltage Vinit to the second node N2. In detail, the second switching transistor T2 may be connected between the first node N1 and the second node N2. The first electrode of the second switching transistor T2 may be connected to the drain electrode of the driving transistor Tdr and the drain electrode of the third switching transistor T3 through the second node N2. Also, the second electrode of the second switching transistor T2 may be connected to the drain electrode of the first switching transistor T1 and the anode electrode of the organic light emitting device OLED through the first node N1. Here, the second switching transistor T2 may supply the initialization voltage Vinit, supplied through the first switching transistor T1, to the third switching transistor T3 during the initialization period t1, and thus, during the initialization period t1, the first electrode of the second switching transistor T2 may correspond to a drain electrode, and the second electrode of the second switching transistor T2 may correspond to a source electrode. Also, during the initialization period t1, the gate electrode of the second switching transistor T2 may be supplied with the third scan signal SC(n)_b having the low level Low through the third scan line SL3. Therefore, in the initialization period t1, the second switching transistor T2 may be turned on and may supply the initialization voltage Vinit to the second node N2.

In the initialization period t1, the third switching transistor T3 may be turned on based on the emission signal EM and may supply the initialization voltage Vinit to the third node N3. In detail, the third switching transistor T3 may be connected between the second node N2 and the third node N3. The drain electrode of the third switching transistor T3 may be connected to the drain electrode of the driving transistor Tdr and the first electrode of the second switching transistor T2 through the second node N2. Also, the source electrode of the third switching transistor T3 may be connected to the gate electrode of the driving transistor Tdr and the one end of the storage capacitor Cst through the third node N3. Also, during the initialization period t1, the gate electrode of the third switching transistor T3 may be supplied with the emission signal EM having a high level High through the emission control line EML. Therefore, in the initialization period t1, the third switching transistor T3 may be turned on and may supply the initialization voltage Vinit to the third node N3.

As a result, during the initialization period t1, the initialization voltage Vinit may sequentially pass through the first, second, and third switching transistors T1, T2, and T3 from the initialization voltage supply line VL1 and may be supplied to the third node N3. In the initialization period t1, the gate electrode of the driving transistor Tdr may receive the initialization voltage Vinit and may be initialized.

Referring to FIG. 5B, in the sampling period t2, the fourth switching transistor T4 may be turned on based on the second scan signal SC(n) and may supply the data voltage Vdata to the fourth node N4. In detail, the fourth switching transistor T4 may be connected between the data line DL and the fourth node N4. The source electrode of the fourth switching transistor T4 may be supplied with the data voltage Vdata through the data line DL, and the drain electrode of the fourth switching transistor T4 may be connected to the source electrode of the driving transistor Tdr and the drain electrode of the fifth switching transistor T5 through the fourth node N4. Also, during the sampling period t2, the gate electrode of the fourth switching transistor T4 may be supplied with the second scan signal SC(n) having the low level Low through the second scan line SL2. Therefore, in the sampling period t2, the fourth switching transistor T4 may be turned on and may supply the data voltage Vdata to the fourth node N4.

In the sampling period t2, the driving transistor Tdr may be turned on based on a voltage of the third node N3 and may control the voltage of the third node N3 which is determined based on the data voltage Vdata and the threshold voltage Vth of the driving transistor Tdr. In detail, the driving transistor Tdr may be connected between the fourth node N4 and the second node N2. The source electrode of the driving transistor Tdr may be connected to the drain electrode of the fourth switching transistor T4 and the drain electrode of the fifth switching transistor T5 through the fourth node N4. Also, the drain electrode of the driving transistor Tdr may be connected to the drain electrode of the third switching transistor T3 and the first electrode of the second switching transistor T2 through the second node N2. Also, during the sampling period t2, the gate electrode of the driving transistor Tdr may receive the voltage of the third node N3. Here, at a time when the initialization period t1 moves to the sampling period t2, the gate electrode of the driving transistor Tdr may be supplied with the initialization voltage Vinit previously applied to the third node N3. When the source electrode of the driving transistor Tdr receives the data voltage Vdata in the sampling period t2 simultaneously with the start of the sampling period t2, the source-gate voltage Vsg of the driving transistor Tdr may be higher than the threshold voltage Vth of the driving transistor Tdr (Vdata−Vinit>|Vth|), and thus, the driving transistor Tdr may be turned on. Since the driving transistor Tdr is turned on, a source-drain current of the driving transistor Tdr may flow from the fourth node N4 to the second node N2.

In the sampling period t2, the third switching transistor T3 may be turned on based on the emission signal EM and may control the voltage of the third node N3 which is determined based on the data voltage Vdata and the threshold voltage Vth of the driving transistor Tdr. In detail, the third switching transistor T3 may be connected between the second node N2 and the third node N3. The drain electrode of the third switching transistor T3 may be connected to the drain electrode of the driving transistor Tdr and the first electrode of the second switching transistor T2 through the second node N2. Also, the source electrode of the third switching transistor T3 may be connected to the gate electrode of the driving transistor Tdr and the one end of the storage capacitor Cst through the third node N3. Also, during the sampling period t2, the gate electrode of the third switching transistor T3 may be supplied with the emission signal EM having the high level High through the emission control line EML. Therefore, in the sampling period t2, the third switching transistor T3 may be turned on and may supply the voltage of the second node N2 to the third node N3. Here, at a time when the driving transistor Tdr is first turned on in the sampling period t2, a source-drain current Isd of the driving transistor Tdr may be determined based on the data voltage Vdata, the initialization voltage Vinit, and the threshold voltage Vth of the driving transistor Tdr (Isd=k*(Vdata−Vinit−|Vth|). Also, during the sampling period t3, the third switching transistor T3 may be turned on to supply the source-drain current Isd of the driving transistor Tdr to the third node N3, and the third node N3 connected to the gate electrode of the third switching transistor T3 may have a voltage which is determined based on the source-drain current Isd of the driving transistor Tdr. In this manner, the voltage of the third node N3 and the source-drain current Isd of the driving transistor Tdr may be shifted from a time when the driving transistor Tdr is first turned on in the sampling period t2, and the voltage of the third node N3 may converge to the difference voltage "Vdata−|Vth|" between the data voltage Vdata and the threshold voltage Vth of the driving transistor Tdr.

Referring to FIG. 5C, in the emission period t3, the fifth switching transistor T5 may be turned on based on the emission signal EM and may supply the driving voltage VDD to the fourth node N4. In detail, the fifth switching transistor T5 may be connected between the driving voltage supply line VL2 and the fourth node N4. The source electrode of the fifth switching transistor T5 may be supplied with the driving voltage VDD through the driving voltage supply line VL2, and the drain electrode of the fifth switching transistor T5 may be connected to the source electrode of the driving transistor Tdr and the drain electrode of the fourth switching transistor T4 through the fourth node N4. Also, during the emission period t3, the gate electrode of the fifth switching transistor T5 may be supplied with the emission signal EM having the low level Low through the emission control line EML. Also, in the emission period t3, the fifth switching transistor T5 may be turned on and may supply the driving voltage VDD to the fourth node N4.

In the emission period t3, the driving transistor Tdr may be turned on based on the voltage of the third node N3 and may supply the driving current Ioled to the organic light emitting device OLED. In detail, the driving transistor Tdr may be connected between the fourth node N4 and the second node N2. The source electrode of the driving transistor Tdr may be connected to the drain electrode of the fourth switching transistor T4 and the drain electrode of the fifth switching transistor T5 through the fourth node N4. Also, the drain electrode of the driving transistor Tdr may be connected to the drain electrode of the third switching transistor T3 and the first electrode of the second switching transistor T2 through the second node N2. Also, during the emission period t3, the gate electrode of the driving transistor Tdr may receive the voltage of the third node N3. Here, the voltage of the third node N3 may converge to the difference voltage "Vdata−|Vth|" between the data voltage Vdata and the threshold voltage Vth of the driving transistor Tdr during the sampling period t2, and since the third switching transistor T3 is turned off during the emission period t3, the third node N3 may hold the difference voltage "Vdata−|Vth|" between the data voltage Vdata and the threshold voltage Vth of the driving transistor Tdr during the emission period t3. Accordingly, during the emission period t3, the driving transistor Tdr may allow the driving current Ioled to flow.

The storage capacitor Cst may control the voltage of the third node N3 during the emission period t3. In detail, the storage capacitor Cst may be connected between the driving voltage supply line VL2 and the third node N3. Therefore, the storage capacitor Cst may store a voltage between the driving voltage supply line VL2 and the third node N3. For example, during the emission period t3, even when the third switching transistor T3 is turned off, the driving voltage VDD applied to the other end of the storage capacitor Cst may be held, and thus, the voltage of the third node N3 applied to the one end of the storage capacitor Cst may be held. As a result, during the emission period t3, even when the third switching transistor T3 is turned off, the storage capacitor Cst may control the voltage of the third node N3, based on a potential difference between the driving voltage VDD and the third node N3.

For example, the driving current Ioled may correspond to the source-drain current Isd of the driving transistor Tdr. Also, a voltage at the source electrode of the driving transistor Tr may correspond to the driving voltage VDD, and a voltage at the gate electrode of the driving transistor Tr may correspond to the difference voltage "Vdata−|Vth|" between the data voltage Vdata and the threshold voltage Vth of the driving transistor Tdr. Therefore, the source-drain current Isd of the driving transistor Tdr may be determined based on the following Equation:

$$Ioled = k*(Vsg-|Vth|)^2 = k*(VDD-(Vdata-|Vth|)-|Vth|)^2 = k*(VDD-Vdata)^2$$

As a result, k may correspond to a constant, and thus, the driving current Ioled may be determined based on the driving voltage VDD and the data voltage Vdata.

As described above, in the organic light emitting display apparatus according to an embodiment of the present disclosure, the third switching transistor T3 may be formed of a metal oxide transistor, and thus, even when the organic light emitting display apparatus is driven at a low frequency, a bezel area is reduced and a high resolution of the display panel is realized. Also, in the organic light emitting display apparatus according to an embodiment of the present disclosure, since the third switching transistor T3 is formed of the metal oxide transistor, a leakage of the driving current Ioled is reduced, thereby preventing deterioration of the organic light emitting device OLED and improving a lifetime of the display panel. Also, in the organic light emitting display apparatus according to an embodiment of the present disclosure, the number of scan lines SL and the number of transistors are reduced, and the pixel driving circuit has a high compensation rate for the driving current Ioled in all gray levels.

In the emission period t3, the second switching transistor T2 may be turned on based on the third scan signal SC(n)_b and may supply the driving current Ioled to the organic light emitting device OLED. In detail, the second switching transistor T2 may be connected between the first node N1 and the second node N2. The first electrode of the second switching transistor T2 may be connected to the drain electrode of the driving transistor Tdr and the drain electrode of the third switching transistor T3 through the second node N2. Also, the second electrode of the second switching transistor T2 may be connected to the drain electrode of the first switching transistor T1 and the anode electrode of the organic light emitting device OLED through the first node N1. Here, since the second switching transistor T2 may supply the driving current Ioled to the organic light emitting device OLED during the emission period t3, the first electrode of the second switching transistor T2 may correspond to a source electrode, and the second electrode of the second switching transistor T2 may correspond to a drain electrode. Also, during the emission period t3, the gate electrode of the second switching transistor T2 may be supplied with the third scan signal SC(n)_b having the low level Low through the third scan line SL3. Therefore, in the emission period t3, the second switching transistor T2 may be turned on and may supply the driving current Ioled to the organic light emitting device OLED.

Figure 6:
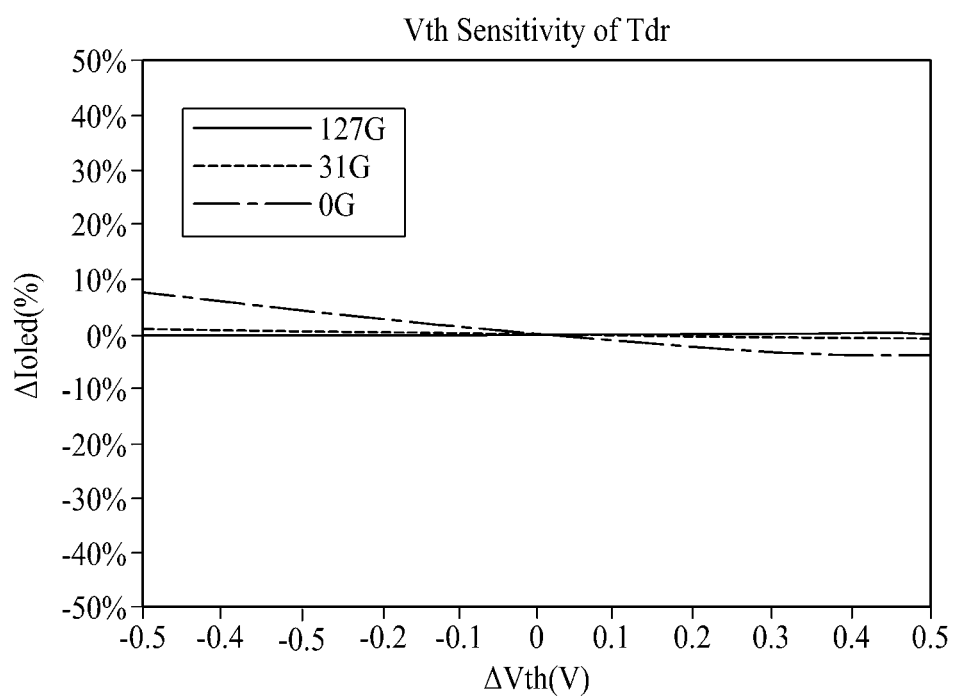
FIG. 6 is a graph for describing a sensitivity of a threshold voltage of a driving transistor of the pixel illustrated in FIG. 2.

FIG. 6 is a graph for describing a sensitivity of a threshold voltage of a driving transistor of the pixel illustrated in FIG. 2.

Referring to FIG. 6, in the organic light emitting display apparatus according to an embodiment of the present disclosure, the third switching transistor T3 may be formed of a metal oxide transistor, and thus, a leakage of the driving current Ioled is reduced, thereby preventing deterioration of the organic light emitting device OLED and improving a lifetime of the display panel.

Generally, a leakage current leaked from the driving current Ioled increases due to a difference between threshold voltages Vth of transistors of the pixel driving circuit. Therefore, in the organic light emitting display apparatus according to an embodiment of the present disclosure, the third switching transistor T3 may be formed of a metal oxide transistor, for preventing the organic light emitting device OLED from being deteriorated by a leakage current which occurs in the driving current Ioled supplied to the organic light emitting device OLED when the organic light emitting display apparatus is driven at a low frequency.

The organic light emitting display apparatus minimizes a leakage current leaked from the driving current Ioled in all gray levels. Here, the gray levels may be represented by gray levels "0 G" to "255 G". As a gray level becomes closer to 0 G, the gray level is close to black, and as a gray level becomes closer to 255 G, the gray level represents contrast close to white.

Moreover, the following Table 1 shows a sensitivity "S" of the driving transistor Tdr with respect to a threshold voltage Vth of each of a plurality of transistors in a specific gray level.

TABLE 1

| Gray level | Vth sensitivity of Tdr |
|---|---|
| 255G | S ≈ 0% |
| 127G | S < 1% |
| 31G | S < 2% |
| 0G | S < 7% |

Here, a result listed in Table 1 shows the sensitivity "S" of the driving transistor Tdr when a difference between the threshold voltages Vth of the plurality of transistors corresponds to −0.5 V to 0.5 V. Also, when a gray level is 255 G, the sensitivity "S" of the driving transistor Tdr is close to 0%, and thus, the sensitivity "S" of the driving transistor Tdr when a gray level is 255 G is omitted in the graph of FIG. 6.

Therefore, referring to FIG. 6 and Table 1, in the organic light emitting display apparatus according to an embodiment of the present disclosure, the pixel driving circuit has a high compensation rate for the driving current Ioled in all gray levels.

Figure 7:
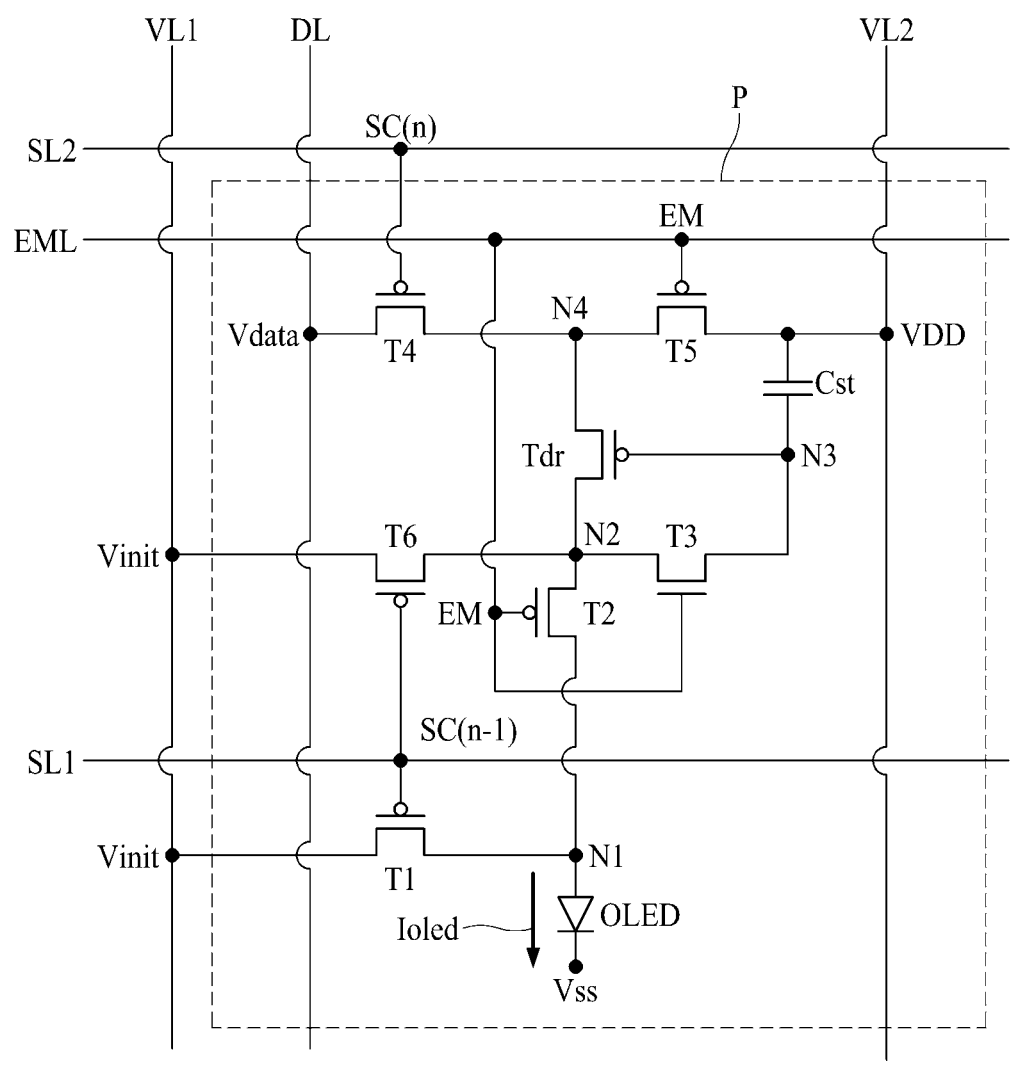
FIG. 7 is a diagram illustrating a structure of a pixel according to a second embodiment of the present disclosure, in an organic light emitting display apparatus according to an embodiment of the present disclosure.
Figure 8:
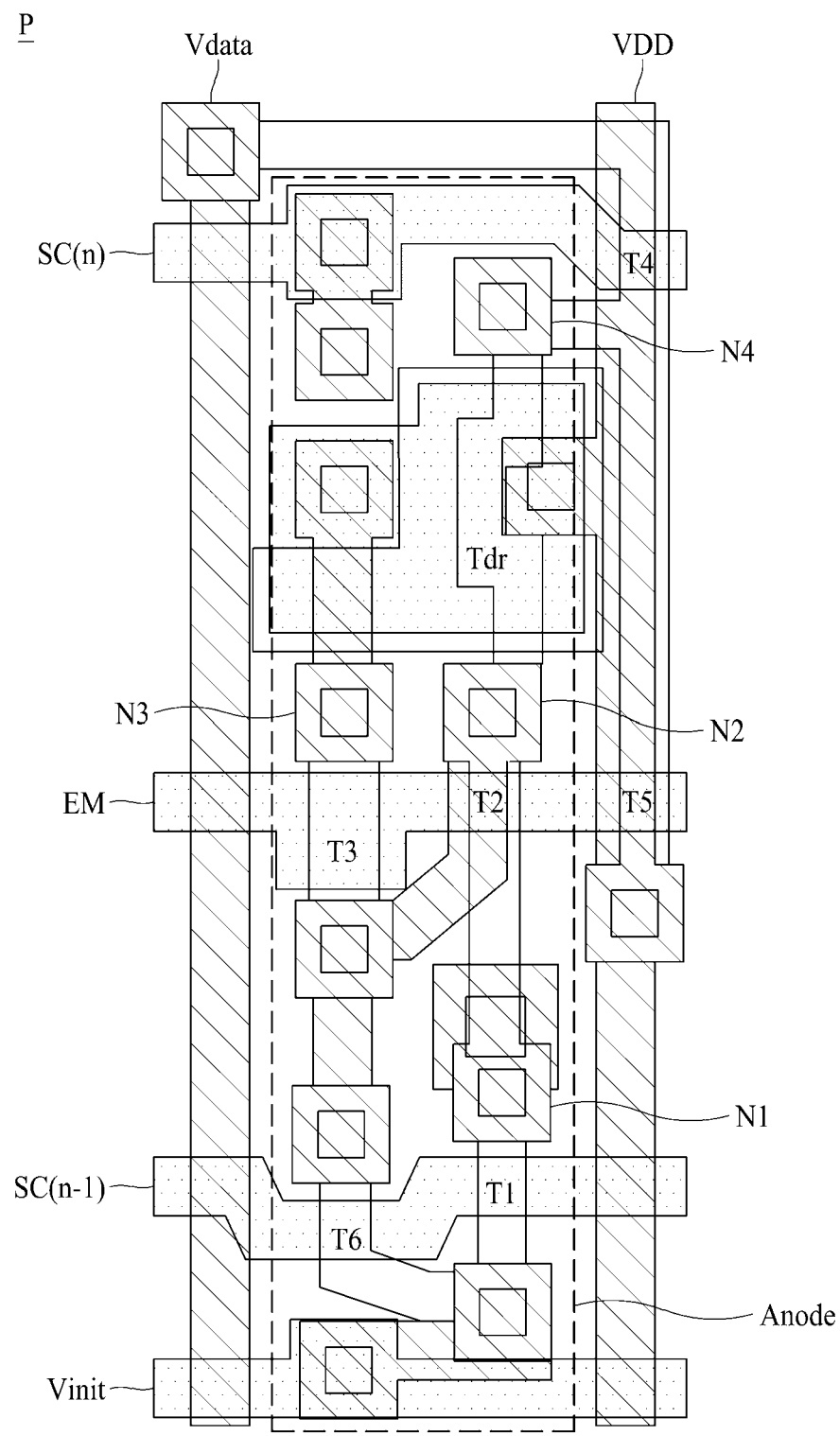
FIG. 8 is a layout diagram of the pixel illustrated in FIG. 7.

FIG. 7 is a diagram illustrating a structure of a pixel according to a second embodiment of the present disclosure, in an organic light emitting display apparatus according to an embodiment of the present disclosure. FIG. 8 is a layout diagram of the pixel illustrated in FIG. 7. Hereinafter, a difference with the first embodiment of the present disclosure will be mainly described, and the same elements as the above-described elements will be briefly described or are not described.

Referring to FIGS. 7 and 8, a plurality of pixels P may each include an organic light emitting device OLED and a pixel driving circuit for driving the organic light emitting device OLED.

The organic light emitting device OLED may is supplied with a driving current from the pixel driving circuit to emit light. The organic light emitting device OLED may be connected to a first node N1 which is a second electrode of a second switching transistor T2 serially connected to a driving transistor Tdr.

The pixel driving circuit may control the driving current Ioled flowing in the organic light emitting device OLED to drive the organic light emitting device OLED. The pixel driving circuit may include the driving transistor Tdr and first to sixth switching transistors T1 to T6.

The driving transistor Tdr may control the driving current Ioled flowing in the organic light emitting device OLED. In detail, the driving transistor Tdr may be connected between a fourth node N4 and a second node N2 and may supply the driving current Ioled to the second switching transistor T2. For example, a source electrode of the driving transistor Tdr may be connected to a drain electrode of the fourth switching transistor T4 and a drain electrode of the fifth switching transistor T5 through the fourth node N4. Also, a drain electrode of the driving transistor Tdr may be connected to a first electrode of the second switching transistor T2, a drain electrode of the third switching transistor T3, and a drain electrode of the sixth switching transistor T6 through the second node N2. Also, a gate electrode of the driving transistor Tdr may be connected to one end of a storage capacitor Cst and a source electrode of the third switching transistor T3 through the third node N3. Therefore, the driving transistor Tdr may be turned on based on a voltage of the third node N3 and may supply the driving current Ioled, supplied from the fourth node N4, to the second node N2.

The first switching transistor T1 may supply an initialization voltage Vinit to the first node N1 connected to the organic light emitting device OLED. In detail, the first switching transistor T1 may be connected between an initialization voltage supply line VL1 and the first node N1 and may supply the initialization voltage Vinit to the first node N1. Therefore, the first switching transistor T1 may be turned on based on a first scan signal SC(n−1) and may supply the initialization voltage Vinit, supplied through the initialization voltage supply line VL1, to the first node N1.

The second switching transistor T2 may selectively connect the first node N1 to the second node N2 which is the drain electrode of the driving transistor Tdr. In detail, the second switching transistor T2 may be connected between the first node N1 and the second node N2 and may supply the driving current Ioled, supplied through the driving transistor Tdr, to the organic light emitting device OLED. For example, a first electrode of the second switching transistor T2 may be connected to the drain electrode of the driving transistor Tdr, a drain electrode of the third switching transistor T3, and the drain electrode of the sixth switching transistor T6 through the second node N2. Also, a second electrode of the second switching transistor T2 may be connected to the drain electrode of the first switching transistor T1 and the anode electrode of the organic light emitting device OLED through the first node N1. Also, a gate electrode of the second switching transistor T2 may be supplied with an emission signal EM through an emission control line EML. Therefore, the second switching transistor T2 may be turned on based on the emission signal EM and may supply the driving current Ioled, supplied through the driving transistor Tdr, to the organic light emitting device OLED. Accordingly, in comparison with the first embodiment, in the organic light emitting display apparatus according to the second embodiment of the present disclosure, the third scan line SL3 is not provided, and thus, the number of scan lines SL is reduced.

The third switching transistor T3 may selectively connect the second node N2 to the third node N3 which is the gate electrode of the driving transistor Tdr. In detail, the third switching transistor T3 may be connected between the second node N2 and the third node N3 and may supply the initialization voltage Vinit to the gate electrode of the driving transistor Tdr or may supply a voltage of the second node N2 to the third node N3. For example, a drain electrode of the third switching transistor T3 may be connected to the drain electrode of the driving transistor Tdr, the first electrode of the second switching transistor T2, and the drain electrode of the sixth switching transistor T6 through the second node N2. Also, a source electrode of the third switching transistor T3 may be connected to the gate electrode of the driving transistor Tdr and the one end of the storage capacitor Cst through the third node N3. Also, a gate electrode of the third switching transistor T3 may be supplied with the emission signal EM through the emission control line EML. Therefore, the third switching transistor T3 may be turned on based on the emission signal EM and may supply the initialization voltage Vinit, supplied from the second node N2, to the third node N3 or may supply the voltage of the second node N2 to the third node N3.

According to an embodiment, the third switching transistor T3 may correspond to a transistor having a type which differs from that of each of the driving transistor Tdr and the first, second, fourth, fifth, and sixth switching transistors T1, T2, T4, T5, and T6. For example, the third switching transistor T3 may correspond to an n-type transistor, and each of the driving transistor Tdr and the first, second, fourth, fifth, and sixth switching transistors T1, T2, T4, T5, and T6 may correspond to a p-type transistor. The third switching transistor T3 may output, through the source electrode, a current flowing to the drain electrode, based on a voltage applied to the gate electrode. Here, the source electrode and the drain electrode of the third switching transistor T3 may switch therebetween, based on a direction of the current. Hereinafter, however, the source electrode and the drain electrode of the third switching transistor T3 may be determined with respect to a direction in which the voltage of the second node N2 is supplied to the third node N3, based on a driving method of each pixel P.

The fourth switching transistor T4 may supply a data voltage Vdata to the fourth node N4 which is the source electrode of the driving transistor Tdr. In detail, the fourth switching transistor T4 may be connected between the data line DL and the fourth node N4 and may supply the data voltage Vdata to the fourth node N4. Therefore, the fourth switching transistor T4 may be turned on based on a second scan signal SC(n) and may supply the data voltage Vdata, supplied through the data line DL, to the fourth node N4.

The fifth switching transistor T5 may supply a driving voltage VDD to the fourth node N4 which is the source electrode of the driving transistor Tdr. In detail, the fifth switching transistor T5 may be connected between the driving voltage supply line VL2 and the fourth node N4 and may supply the driving voltage VDD to the fourth node N4. Therefore, the fifth switching transistor T5 may be turned on based on the emission signal EM and may supply the driving voltage VDD, supplied through the driving voltage supply line VL2, to the fourth node N4.

The sixth switching transistor T6 may supply the initialization voltage Vinit to the second node N2 connected to the drain electrode of the driving transistor Tdr. In detail, the sixth switching transistor T6 may be connected between the initialization voltage supply line VL1 and the second node N2 and may supply the initialization voltage Vinit to the second nod N2. For example, a source electrode of the sixth switching transistor T6 may be connected to the initialization voltage supply line VL1, the drain electrode of the sixth switching transistor T6 may be connected to the second node N2, and a gate electrode of the sixth switching transistor T6 may be connected to a first scan line SL1. Also, the source electrode of the sixth switching transistor T6 may be supplied with the initialization voltage Vinit through the initialization voltage supply line VL1, and the gate electrode of the sixth switching transistor T6 may be supplied with the first scan signal SC(n−1) through the first scan line SL1. Also, the drain electrode of the sixth switching transistor T6 may be connected to the drain electrode of the driving transistor Tdr, the first electrode of the second switching transistor T2, and the drain electrode of the third switching transistor T3 through the second node N2. Therefore, the sixth switching transistor T6 may be turned on based on the first scan signal SC(n−1) and may supply the initialization voltage Vinit, supplied through the initialization voltage supply line VL1, to the second node N2.

According to an embodiment, the third switching transistor T3 may be implemented with a metal oxide transistor. In the organic light emitting display apparatus according to an embodiment of the present disclosure, the third switching transistor T3 may be implemented with the metal oxide transistor which differs from the driving transistor Tdr and the first, second, fourth, fifth, and sixth switching transistors T1, T2, T4, T5, and T6, and thus, even when the organic light emitting display apparatus is driven at a low frequency, a bezel area is reduced and a high resolution of a display panel is realized. Also, in the organic light emitting display apparatus according to an embodiment of the present disclosure, since the third switching transistor T3 is implemented with the metal oxide transistor, a leakage of the driving current Ioled is reduced, the number of scan lines SL and the number of transistors are reduced, and the pixel driving circuit has a high compensation rate for the driving current Ioled in all gray levels.

Figure 9:
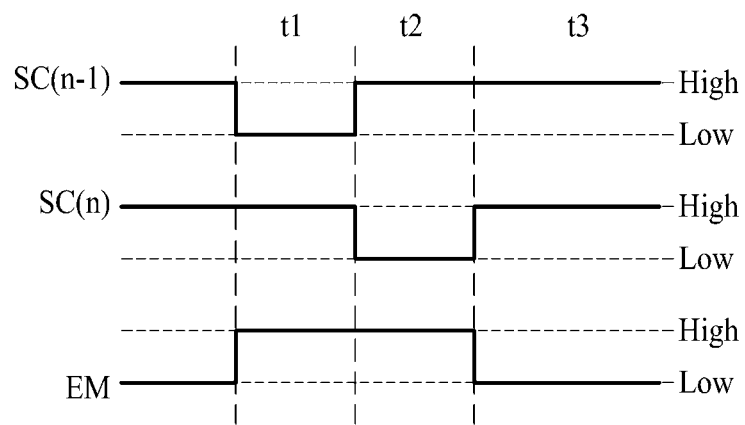
FIG. 9 is a waveform diagram of signals supplied to the pixel illustrated in FIG. 7.

FIG. 9 is a waveform diagram of signals supplied to the pixel illustrated in FIG. 7.

Referring to FIG. 9, each of the plurality of pixels P may be divisionally driven in an initialization period t1, a sampling period t2, and an emission period t3.

The first scan line SL1 may be connected to the gate electrode of each of the first and sixth switching transistors T1 and T6. Also, the first scan line SL1 may supply the first scan signal SC(n−1) to the gate electrode of the sixth switching transistor T6 to turn on/off the sixth switching transistor T6. In detail, the first scan line SL1 may supply the first scan signal SC(n−1) to the gate electrode of the first switching transistor T1 to turn on/off the first switching transistor T1. Here, the first scan signal SC(n−1) may have a low level Low in only the initialization period t1 and may have a high level High in the sampling period t2 and the emission period t3. Therefore, in only the initialization period t1, the first switching transistor T1 may receive the first scan signal SC(n−1) having the low level Low, and thus, may be turned on to supply the initialization voltage Vinit to the first node N1. Also, in only the initialization period t1, the sixth switching transistor T6 may receive the first scan signal SC(n−1) having the low level Low, and thus, may be turned on to supply the initialization voltage Vinit to the second node N2.

The second scan line SL2 may be connected to the gate electrode of the fourth switching transistor T4. In detail, the second scan signal SC(n) may have a low level Low in only the sampling period t2 and may have a high level High in the initialization period t1 and the emission period t3. Therefore, in only the sampling period t2, the fourth switching transistor T4 may receive the second scan signal SC(n) having the low level Low, and thus, may be turned on to supply the data voltage Vdata to the fourth node N4.

The emission control line EML may be connected to the gate electrode of each of the second, third, and fifth switching transistors T2, T3, and T5. In detail, the emission control line EML may supply the emission signal EM to the gate electrode of each of the second, third, and fifth switching transistors T2, T3, and T5 to turn on/off the second, third, and fifth switching transistors T2, T3, and T5. Here, the emission signal EM may have a high level High in the initialization period t1 and the sampling period t2 and may have the low level Low in the emission period t3. Therefore, in each of the initialization period t1 and the sampling period t2, the second switching transistor T2 may receive the emission signal EM having the high level High, and thus, may be turned off. Also, in the initialization period t1, the third switching transistor T3 may receive the emission signal EM having the high level High, and thus, may be turned on to supply the initialization voltage Vinit to the third node N3. Also, in the sampling period t2, the third switching transistor T3 may receive the emission signal EM having the high level High, and thus, may be turned on to supply the voltage of the second node N2 to the third node N3. In this case, during the sampling period t2, a voltage applied to the gate electrode and the drain electrode of the driving transistor Tdr may correspond to a difference voltage "Vdata−|Vth|" between the data voltage Vdata and the threshold voltage Vth of the driving transistor Tdr. Also, in the emission period t3, the fifth switching transistor T5 may receive the emission signal EM having the low level Low, and thus, may be turned on to supply the driving voltage VDD to the fourth node N4.

Figure 10A:
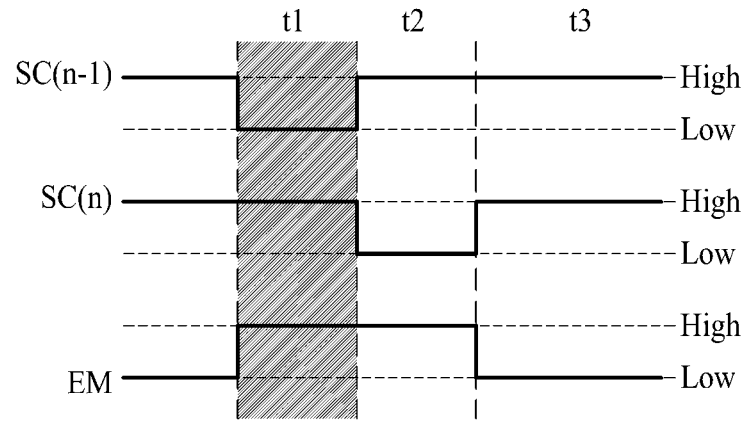
FIGS. 10A to 10C are diagrams for describing a driving method of the pixel illustrated in FIG. 7.
Figure 10A:
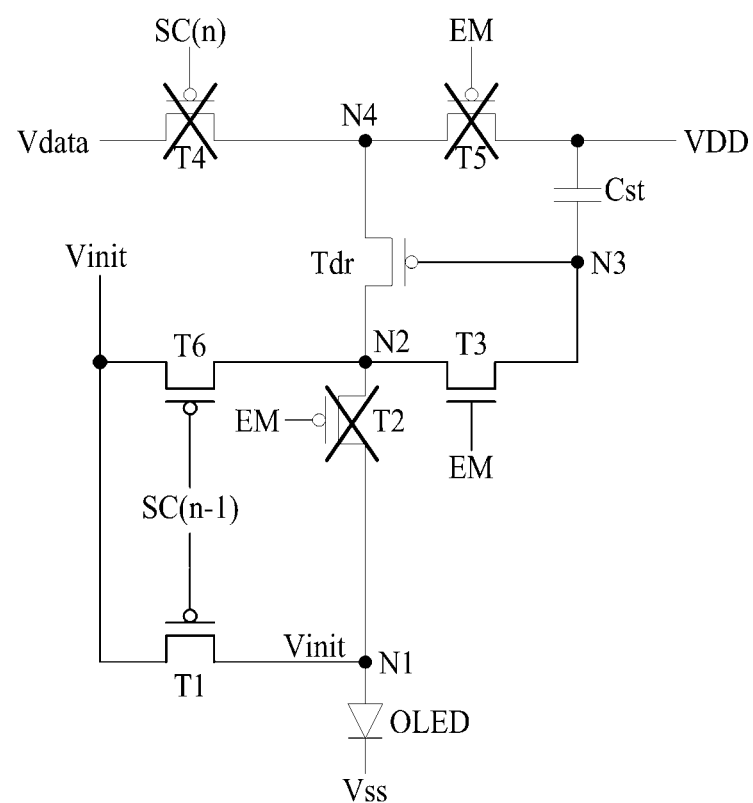
Figure 10B:
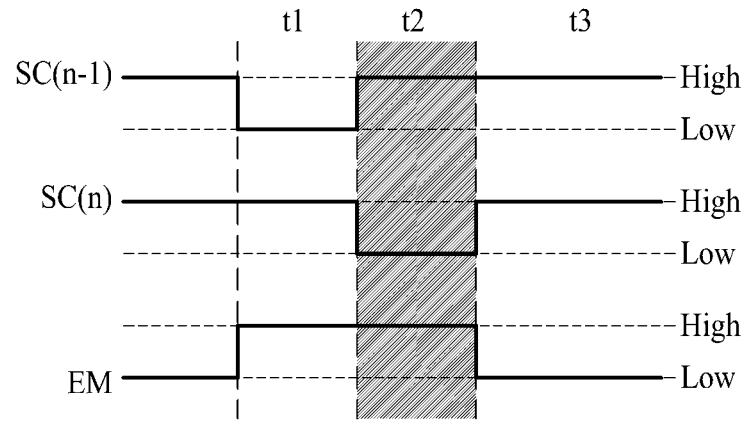
Figure 10B:
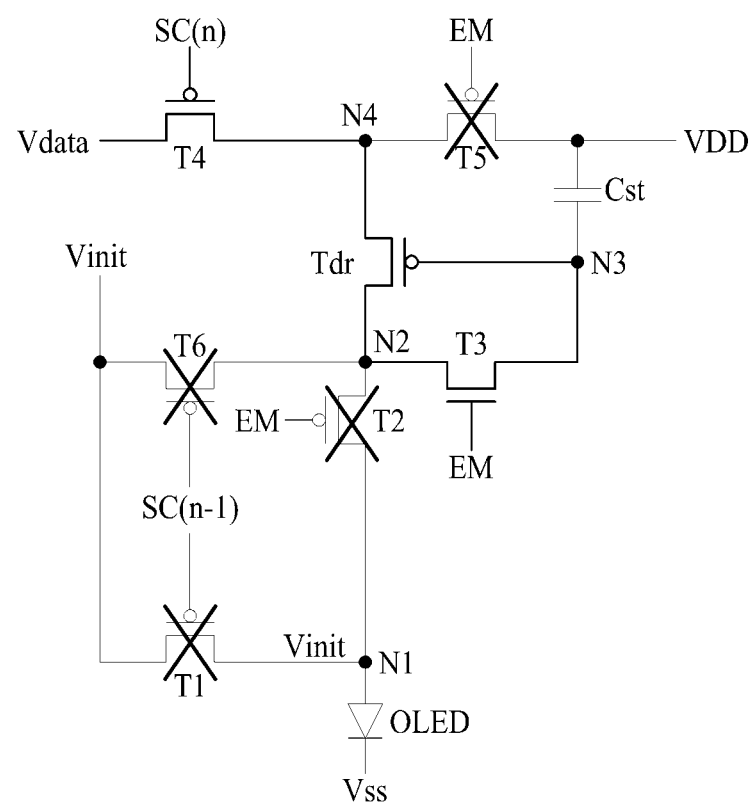
Figure 10C:
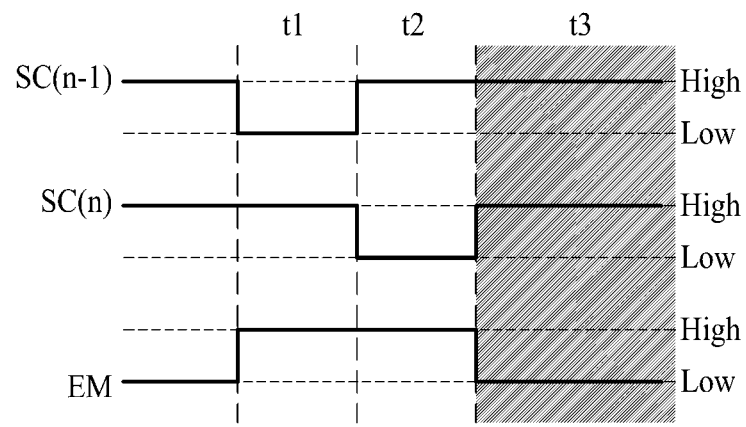
Figure 10C:
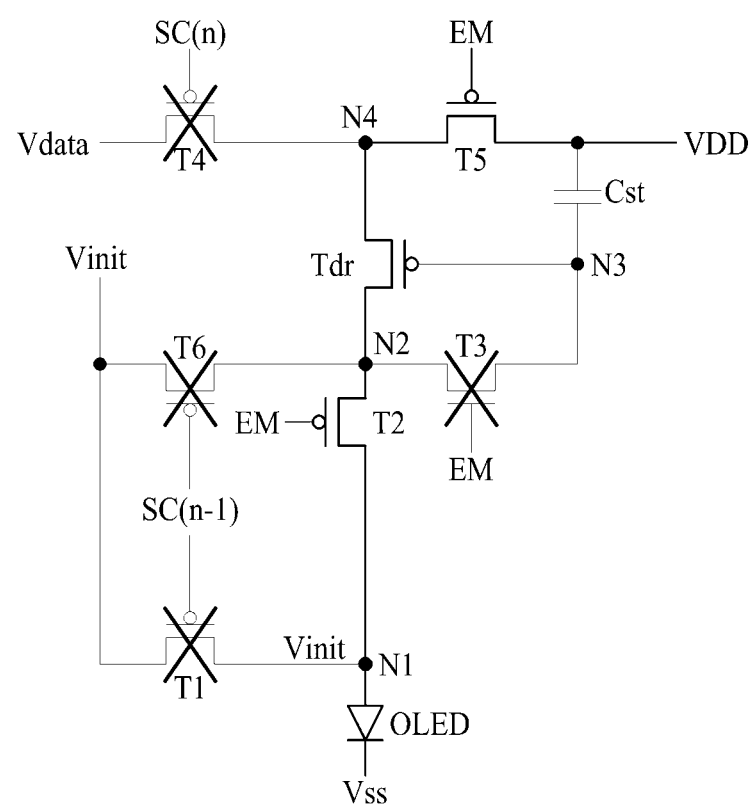

FIGS. 10A to 10C are diagrams for describing a driving method of the pixel illustrated in FIG. 7. In detail, FIG. 10A illustrates a driving method of a pixel P during an initialization period t1, FIG. 10B illustrates a driving method of the pixel P during a sampling period t2, and FIG. 10C illustrates a driving method of the pixel P during an emission period t3.

Referring to FIG. 10A, each of the plurality of pixels P may be divisionally driven in the initialization period t1, the sampling period t2, and the emission period t3.

In the initialization period t1, the first switching transistor T1 may be turned on based on the first scan signal SC(n−1) and may supply the initialization voltage Vinit to the first node N1. In detail, the first switching transistor T1 may be connected between the initialization voltage supply line VL1 and the first node N1. Also, during the initialization period t1, the gate electrode of the first switching transistor T1 may be supplied with the first scan signal SC(n−1) having a low level Low through the first scan line SL1. Therefore, in the initialization period t1, the first switching transistor T1 may be turned on and may supply the initialization voltage Vinit to the first node N1.

In the initialization period t1, the sixth switching transistor T6 may be turned on based on the first scan signal SC(n−1) and may supply the initialization voltage Vinit to the second node N2. In detail, the sixth switching transistor T6 may be connected between the initialization voltage supply line VL1 and the second node N2. The source electrode of the sixth switching transistor T6 may be supplied with the initialization voltage Vinit through the initialization voltage supply line VL1, and the drain electrode of the sixth switching transistor T6 may be connected to the first electrode of the second switching transistor T2, the drain electrode of the third switching transistor T3, and the drain electrode of the driving transistor Tdr through the second node N2. Also, during the initialization period t1, the gate electrode of the sixth switching transistor T6 may be supplied with the first scan signal SC(n−1) having the low level Low through the first scan line SL1. Therefore, in the initialization period t1, the sixth switching transistor T6 may be turned on and may supply the initialization voltage Vinit to the second node N2.

In the initialization period t1, the third switching transistor T3 may be turned on based on the emission signal EM and may supply the initialization voltage Vinit to the third node N3. In detail, the third switching transistor T3 may be connected between the second node N2 and the third node N3. The drain electrode of the third switching transistor T3 may be connected to the first electrode of the second switching transistor T2, the drain electrode of the sixth switching transistor T6, and the drain electrode of the driving transistor Tdr through the second node N2. Also, the source electrode of the third switching transistor T3 may be connected to the gate electrode of the driving transistor Tdr and the one end of the storage capacitor Cst through the third node N3. Also, during the initialization period t1, the gate electrode of the third switching transistor T3 may be supplied with the emission signal EM having a high level High through the emission control line EML. Therefore, in the initialization period t1, the third switching transistor T3 may be turned on and may supply the initialization voltage Vinit to the third node N3.

As a result, during the initialization period t1, the initialization voltage Vinit may sequentially pass through the sixth and third switching transistors T6 and T3 from the initialization voltage supply line VL1 and may be supplied to the third node N3. In the initialization period t1, the gate electrode of the driving transistor Tdr may receive the initialization voltage Vinit and may be initialized.

Referring to FIG. 10B, in the sampling period t2, the fourth switching transistor T4 may be turned on based on the second scan signal SC(n) and may supply the data voltage Vdata to the fourth node N4. In detail, the fourth switching transistor T4 may be connected between the data line DL and the fourth node N4. Also, during the sampling period t2, the gate electrode of the fourth switching transistor T4 may be supplied with the second scan signal SC(n) having the low level Low through the second scan line SL2. Therefore, in the sampling period t2, the fourth switching transistor T4 may be turned on and may supply the data voltage Vdata to the fourth node N4.

In the sampling period t2, the driving transistor Tdr may be turned on based on a voltage of the third node N3 and may control the voltage of the third node N3 which is determined based on the data voltage Vdata and the threshold voltage Vth of the driving transistor Tdr. In detail, the driving transistor Tdr may be connected between the fourth node N4 and the second node N2. Also, during the sampling period t2, the gate electrode of the driving transistor Tdr may receive the voltage of the third node N3. Here, at a time when the initialization period t1 moves to the sampling period t2, the gate electrode of the driving transistor Tdr may be supplied with the initialization voltage Vinit previously applied to the third node N3. When the source electrode of the driving transistor Tdr receives the data voltage Vdata in the sampling period t2 simultaneously with the start of the sampling period t2, the source-gate voltage Vsg of the driving transistor Tdr may be higher than the threshold voltage Vth of the driving transistor Tdr (Vdata−

Vinit>|Vth|), and thus, the driving transistor Tdr may be turned on. Since the driving transistor Tdr is turned on, a source-drain current of the driving transistor Tdr may flow from the fourth node N4 to the second node N2.

In the sampling period t2, the third switching transistor T3 may be turned on based on the emission signal EM and may control the voltage of the third node N3 which is determined based on the data voltage Vdata and the threshold voltage Vth of the driving transistor Tdr. In detail, the third switching transistor T3 may be connected between the second node N2 and the third node N3. Also, the source electrode of the third switching transistor T3 may be connected to the gate electrode of the driving transistor Tdr and the one end of the storage capacitor Cst through the third node N3. Also, during the sampling period t2, the gate electrode of the third switching transistor T3 may be supplied with the emission signal EM having the high level High through the emission control line EML. Therefore, in the sampling period t2, the third switching transistor T3 may be turned on and may supply the voltage of the second node N2 to the third node N3. Here, at a time when the driving transistor Tdr is first turned on in the sampling period t2, a source-drain current Isd of the driving transistor Tdr may be determined based on the data voltage Vdata, the initialization voltage Vinit, and the threshold voltage Vth of the driving transistor Tdr (Isd=k*(Vdata−Vinit−|Vth|). Also, during the sampling period t3, the third switching transistor T3 may be turned on to supply the source-drain current Isd of the driving transistor Tdr to the third node N3, and the third node N3 connected to the gate electrode of the third switching transistor T3 may have a voltage which is determined based on the source-drain current Isd of the driving transistor Tdr. In this manner, the voltage of the third node N3 and the source-drain current Isd of the driving transistor Tdr may be shifted from a time when the driving transistor Tdr is first turned on in the sampling period t2, and the voltage of the third node N3 may converge to the difference voltage "Vdata−|Vth|" between the data voltage Vdata and the threshold voltage Vth of the driving transistor Tdr.

Referring to FIG. 10C, in the emission period t3, the fifth switching transistor T5 may be turned on based on the emission signal EM and may supply the driving voltage VDD to the fourth node N4. In detail, the fifth switching transistor T5 may be connected between the driving voltage supply line VL2 and the fourth node N4. Also, during the emission period t3, the gate electrode of the fifth switching transistor T5 may be supplied with the emission signal EM having the low level Low through the emission control line EML. Also, in the emission period t3, the fifth switching transistor T5 may be turned on and may supply the driving voltage VDD to the fourth node N4.

In the emission period t3, the driving transistor Tdr may be turned on based on the voltage of the third node N3 and may supply the driving current Ioled to the organic light emitting device OLED. In detail, the driving transistor Tdr may be connected between the fourth node N4 and the second node N2. Also, during the emission period t3, the gate electrode of the driving transistor Tdr may receive the voltage of the third node N3. Here, the voltage of the third node N3 may converge to the difference voltage "Vdata−|Vth|" between the data voltage Vdata and the threshold voltage Vth of the driving transistor Tdr during the sampling period t2, and since the third switching transistor T3 is turned off during the emission period t3, the third node N3 may hold the difference voltage "Vdata−|Vth|" between the data voltage Vdata and the threshold voltage Vth of the driving transistor Tdr during the emission period t3. Accordingly, during the emission period t3, the driving transistor Tdr may allow the driving current Ioled to flow.

The storage capacitor Cst may control the voltage of the third node N3 during the emission period t3. In detail, during the emission period t3, even when the third switching transistor T3 is turned off, the driving voltage VDD applied to the other end of the storage capacitor Cst may be held, and thus, the voltage of the third node N3 applied to the one end of the storage capacitor Cst may be held. As a result, during the emission period t3, even when the third switching transistor T3 is turned off, the storage capacitor Cst may control the voltage of the third node N3, based on a potential difference between the driving voltage VDD and the third node N3.

As described above, in the organic light emitting display apparatus according to an embodiment of the present disclosure, the third switching transistor T3 may be formed of a metal oxide transistor, and thus, even when the organic light emitting display apparatus is driven at a low frequency, a bezel area is reduced and a high resolution of the display panel is realized. Also, in the organic light emitting display apparatus according to an embodiment of the present disclosure, since the third switching transistor T3 is formed of the metal oxide transistor, a leakage of the driving current Ioled is reduced, thereby preventing deterioration of the organic light emitting device OLED and improving a lifetime of the display panel. Also, in the organic light emitting display apparatus according to an embodiment of the present disclosure, the number of scan lines SL and the number of transistors are reduced, and the pixel driving circuit has a high compensation rate for the driving current Ioled in all gray levels.

In the emission period t3, the second switching transistor T2 may be turned on based on the emission signal EM and may supply the driving current Ioled to the organic light emitting device OLED. In detail, the second switching transistor T2 may be connected between the first node N1 and the second node N2. The first electrode of the second switching transistor T2 may be connected to the drain electrode of the driving transistor Tdr and the drain electrode of the third switching transistor T3 through the second node N2. Also, the second electrode of the second switching transistor T2 may be connected to the drain electrode of the first switching transistor T1 and the anode electrode of the organic light emitting device OLED through the first node N1. Here, since the second switching transistor T2 may supply the driving current Ioled to the organic light emitting device OLED during the emission period t3, the first electrode of the second switching transistor T2 may correspond to a source electrode, and the second electrode of the second switching transistor T2 may correspond to a drain electrode. Also, during the emission period t3, the gate electrode of the second switching transistor T2 may be supplied with the emission signal EM having the low level Low through the emission control line EML. Therefore, in the emission period t3, the second switching transistor T2 may be turned on and may supply the driving current Ioled to the organic light emitting device OLED.

Figure 11:
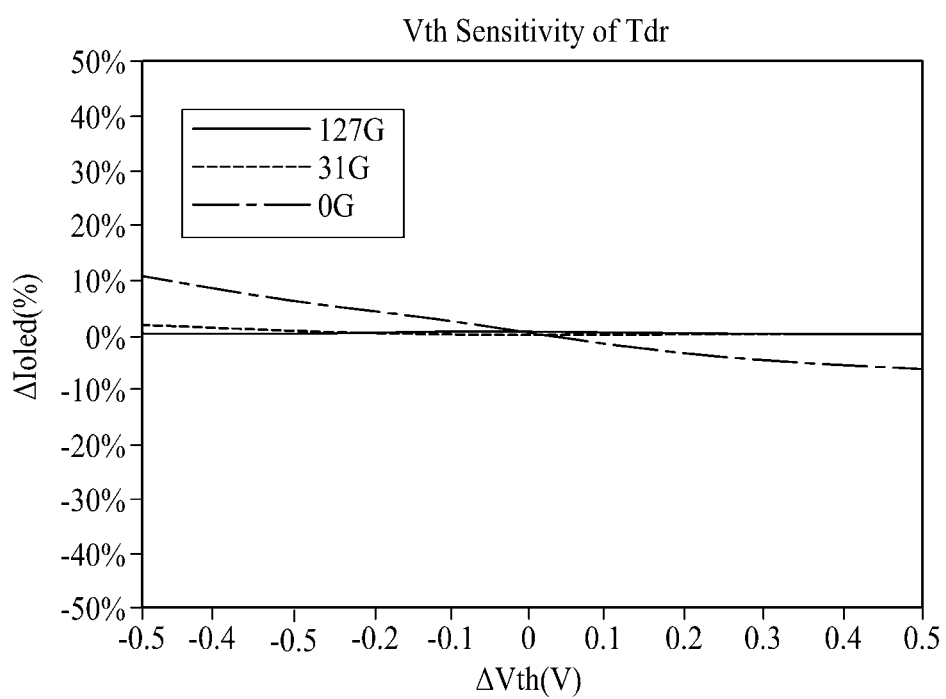
FIG. 11 is a graph for describing a sensitivity of a threshold voltage of a driving transistor of the pixel illustrated in FIG. 7.

FIG. 11 is a graph for describing a sensitivity of a threshold voltage of a driving transistor of the pixel illustrated in FIG. 7.

Referring to FIG. 7, in the organic light emitting display apparatus according to an embodiment of the present disclosure, the third switching transistor T3 may be formed of a metal oxide transistor, and thus, a leakage of the driving current Ioled is reduced, thereby preventing deterioration of the organic light emitting device OLED and improving a lifetime of the display panel.

Generally, a leakage current leaked from the driving current Ioled increases due to a difference between threshold voltages Vth of transistors of the pixel driving circuit. Therefore, in the organic light emitting display apparatus according to an embodiment of the present disclosure, the third switching transistor T3 may be formed of a metal oxide transistor, for preventing the organic light emitting device OLED from being deteriorated by a leakage current which occurs in the driving current Ioled supplied to the organic light emitting device OLED when the organic light emitting display apparatus is driven at a low frequency.

The organic light emitting display apparatus minimizes a leakage current leaked from the driving current Ioled in all gray levels. Also, the following Table 2 shows a sensitivity "S" of the driving transistor Tdr with respect to a threshold voltage Vth of each of a plurality of transistors in a specific gray level.

TABLE 2

| Gray level | Vth sensitivity of Tdr |
|---|---|
| 255G | S ≈ 0% |
| 127G | S < 1% |
| 31G | S < 2% |
| 0G | S < 11% |

Here, a result listed in Table 2 shows the sensitivity "S" of the driving transistor Tdr when a difference between the threshold voltages Vth of the plurality of transistors corresponds to −0.5 V to 0.5 V. Also, when a gray level is 255 G, the sensitivity "S" of the driving transistor Tdr is close to 0%, and thus, the sensitivity "S" of the driving transistor Tdr when a gray level is 255 G is omitted in the graph of FIG. 11.

Therefore, referring to FIG. 11 and Table 2, in the organic light emitting display apparatus according to an embodiment of the present disclosure, the pixel driving circuit has a high compensation rate for the driving current Ioled in all gray levels.

As a result, in the organic light emitting display apparatus according to an embodiment of the present disclosure, the third switching transistor T3 may be formed of a metal oxide transistor having a type which differs from that of each of the other transistors, and thus, even when the organic light emitting display apparatus is driven at a low frequency, a bezel area is reduced and a high resolution of the display panel is realized. Also, in the organic light emitting display apparatus according to an embodiment of the present disclosure, since the third switching transistor T3 is formed of the metal oxide transistor, a leakage of the driving current Ioled is reduced, and the number of scan lines SL and the number of transistors are reduced, thereby providing a pixel driving circuit which has a high compensation rate for the driving current Ioled in all gray levels.

As described above, in the organic light emitting display apparatus according to the embodiments of the present disclosure, a metal oxide transistor may be used, and thus, even when the organic light emitting display apparatus is driven at a low frequency, a bezel area is reduced and a high resolution of a display panel is realized.

Moreover, in the organic light emitting display apparatus according to the embodiments of the present disclosure, by using the metal oxide transistor, a leakage of a driving current is reduced, and the number of scan lines and the number of transistors are reduced.

Moreover, in the organic light emitting display apparatus according to the embodiments of the present disclosure, by using the metal oxide transistor, a pixel driving circuit has a high compensation rate for a driving current in all gray levels.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
a plurality of pixels each including a light emitting device and a pixel driving circuit driving the light emitting device, the plurality of pixels being respectively provided in a plurality of pixel areas,
wherein the pixel driving circuit comprises:
a driving transistor controlling a driving current flowing in the light emitting device;
a first switching transistor supplying an initialization voltage to a first node connected to the light emitting device;
a second switching transistor selectively connecting the first node to a second node which is a drain electrode of the driving transistor;
a third switching transistor selectively connecting the second node to a third node which is a gate electrode of the driving transistor;
a fourth switching transistor supplying a data voltage to a fourth node which is a source electrode of the driving transistor; and
a fifth switching transistor supplying a driving voltage to the fourth node, and
the third switching transistor is a type which differs from a type of each of the driving transistor and the first, second, fourth, and fifth switching transistors,
wherein the third switching transistor and the fifth switching transistor are switched opposite to each other at a same time based on one emission signal,
wherein a gate electrode of the third switching transistor and a gate electrode of the fifth switching transistor are both connected to an emission control line configured to supply the one emission signal, and
wherein each of the driving transistor and the first, second, fourth, and fifth switching transistors corresponds to a p-type transistor, and the third switching transistor corresponds to an n-type transistor.

2. The display apparatus of claim 1, wherein each of the plurality of pixels is driven in an initialization period, a sampling period, and an emission period, and
in the initialization period, the first switching transistor is turned on based on a first scan signal and supplies the initialization voltage to the first node.

3. The display apparatus of claim 2, wherein
in the initialization period, the second switching transistor is turned on based on a signal opposite to a second scan signal and supplies the initialization voltage to the second node, and in the initialization period the fourth switching transistor is turned off based on the second scan signal, and
in the emission period, the second switching transistor is turned on and supplies the driving current to the light emitting device.

4. The display apparatus of claim 2, wherein
in the initialization period, the third switching transistor is turned on based on the one emission signal and supplies the initialization voltage to the third node, and
in the sampling period, the third switching transistor is turned on and controls a voltage of the third node determined based on the data voltage and a threshold voltage of the driving transistor.

5. The display apparatus of claim 2, wherein, in the sampling period, the fourth switching transistor is turned on based on a second scan signal and supplies the data voltage to the fourth node.

6. The display apparatus of claim 2, wherein, in the emission period, the fifth switching transistor is turned on based on the one emission signal and supplies the driving voltage to the fourth node.

7. The display apparatus of claim 2, wherein
in the sampling period, the driving transistor is turned on based on a voltage of the third node and controls a voltage of the third node determined based on the data voltage and a threshold voltage of the driving transistor, and
in the emission period, the driving transistor is turned on and supplies the driving current to the second node.

8. The display apparatus of claim 2, wherein
in the initialization period, the first scan signal turns on the first switching transistor,
in the sampling period, a second scan signal turns on the fourth switching transistor, and
in the initialization period and the emission period, a signal opposite to the second scan signal turns on the second switching transistor.

9. The display apparatus of claim 2, further comprising a sixth switching transistor supplying the initialization voltage to the second node.

10. The display apparatus of claim 9, wherein, in the initialization period, the sixth switching transistor is turned on based on the first scan signal and supplies the initialization voltage to the second node.

11. The display apparatus of claim 9, wherein, in the emission period, the second switching transistor is turned on based on the one emission signal and supplies the driving current to the light emitting device.

12. The display apparatus of claim 9, wherein
in the initialization period and the sampling period, the one emission signal turns on the third switching transistor, and
in the emission period, the one emission signal turns on the second and fifth switching transistors.

13. The display apparatus of claim 9, wherein
in the initialization period, the first scan signal turns on the first and sixth switching transistors, and
in the sampling period, a second scan signal turns on the fourth switching transistor.

14. The display apparatus of claim 2, further comprising a storage capacitor connected to a source electrode of the fifth switching transistor and a third node connected to the gate electrode of the driving transistor.

15. A display apparatus comprising a plurality of pixels, each of the pixels including a light emitting device and a pixel driving circuit driving the light emitting device, wherein the pixel driving circuit comprises:
a driving transistor connected to a first node between the driving transistor and the light emitting device and controlling a driving current flowing in the light emitting device;
a storage capacitor, one end of the storage capacitor connected to a gate electrode of the driving transistor;
a first transistor selectively connecting the first node between the driving transistor and the light emitting device to a second node connected to the gate electrode of the driving transistor; and
a second transistor supplying a driving voltage to a third node connected to a source electrode of the driving transistor,
wherein the first transistor is a type which differs from a type of each of the driving transistor and the second transistor,
wherein the first transistor and the second transistor are switched opposite to each other at a same time based on one emission signal,
wherein a gate electrode of the first transistor and a gate electrode of the second transistor are both connected to an emission control line configured to supply the one emission signal, and
wherein each of the driving transistor and the second transistor corresponds to a p-type transistor, and the first transistor corresponds to an n-type transistor.

16. The display apparatus of claim 15, wherein the first transistor is a metal oxide transistor.

17. The display apparatus of claim 15, further comprising a third transistor configured to supply an initialization voltage to the first node between the driving transistor and the light emitting device, wherein the third transistor is connected to the first node between the driving transistor and the light emitting device.

18. The display apparatus of claim 17, wherein the third transistor is connected between the driving transistor and the light emitting device.

19. The display apparatus of claim 17, wherein the third transistor is connected between the driving transistor and an initialization voltage supply line configured to supply the initialization voltage the driving transistor.

* * * * *